United States Patent
Hsu et al.

(10) Patent No.: US 8,895,386 B2
(45) Date of Patent: Nov. 25, 2014

(54) METHOD OF FORMING SEMICONDUCTOR STRUCTURE

(71) Applicants: Chen-Chiu Hsu, Hsinchu (TW); Tung-Ming Lai, Hsinchu (TW); Kai-An Hsueh, Miaoli County (TW); Ming-De Huang, New Taipei (TW)

(72) Inventors: Chen-Chiu Hsu, Hsinchu (TW); Tung-Ming Lai, Hsinchu (TW); Kai-An Hsueh, Miaoli County (TW); Ming-De Huang, New Taipei (TW)

(73) Assignee: Maxchip Electronics Corp., Hsinchu (TW)

( * ) Notice: Subject to any disclaimer, the term of this patent is extended or adjusted under 35 U.S.C. 154(b) by 51 days.

(21) Appl. No.: 13/632,162

(22) Filed: Oct. 1, 2012

(65) Prior Publication Data

US 2014/0024183 A1    Jan. 23, 2014

(30) Foreign Application Priority Data

Jul. 18, 2012 (TW) .............................. 101125879 A

(51) Int. Cl.
*H01L 21/8242* (2006.01)

(52) U.S. Cl.
USPC ........... 438/241; 438/257; 438/288; 438/593; 257/E21.679; 257/E21.66

(58) Field of Classification Search
CPC ...................... H01L 21/28273; H01L 27/1153
USPC ......... 438/201, 210, 211, 288, 241, 257, 293; 257/E21.66, E21.678, E21.679
See application file for complete search history.

(56) References Cited

U.S. PATENT DOCUMENTS

| | | | |
|---|---|---|---|
| 5,879,990 A | 3/1999 | Dormans et al. | |
| 2003/0011017 A1* | 1/2003 | Lee et al. | 257/314 |
| 2006/0261398 A1* | 11/2006 | Lee | 257/314 |
| 2008/0290401 A1* | 11/2008 | Yasui et al. | 257/324 |
| 2009/0111226 A1* | 4/2009 | Chindalore | 438/258 |
| 2011/0272752 A1* | 11/2011 | Asami | 257/298 |
| 2013/0020623 A1* | 1/2013 | Tsui et al. | 257/300 |

* cited by examiner

*Primary Examiner* — Julia Slutsker
(74) *Attorney, Agent, or Firm* — Jianq Chyun IP Office

(57) ABSTRACT

A method of forming a semiconductor structure is provided. A substrate having a cell area and a periphery area is provided. An oxide material layer and a first conductive material layer are sequentially formed on the substrate in the cell and periphery areas. A patterning step is performed to form first and second stacked structures on the substrate respectively in the cell and periphery areas. First and second spacers are formed respectively on sidewalls of the first and second stacked structures. At least two first doped regions are formed in the substrate beside the first stacked structure, and two second doped regions are formed in the substrate beside the second stacked structure. A dielectric layer and a second conductive layer are formed at least on the first stacked structure. The first stacked structure, the dielectric layer, and the second conductive layer in the cell area constitute a charge storage structure.

14 Claims, 20 Drawing Sheets ns structure

METHOD OF FORMING SEMICONDUCTOR STRUCTURE

CROSS-REFERENCE TO RELATED APPLICATION

This application claims the priority benefit of Taiwan application serial no. 101125879, filed on Jul. 18, 2012. The entirety of the above-mentioned patent application is hereby incorporated by reference herein and made a part of this specification.

BACKGROUND OF THE INVENTION

1. Field of Invention

The invention relates to a method of forming a semiconductor structure, and more particularly, to a method of forming a semiconductor structure in which a memory unit is integrated with a peripheral logic device, a resistor, or a capacitor.

2. Background of the Invention

Data may be repeatedly written into, read from, and erased from non-volatile memory devices, and the data stored in the non-volatile memory devices may be retained even after power supplies of the devices are cut off. Therefore, the non-volatile memory devices have been extensively applied to personal computers and electronic equipment.

An erasable programmable read-only memory with tunnel oxide (i.e., EPROM with tunnel oxide, ETOX) is one of the common memory cell structures. In the ETOX, a floating gate and a control gate for performing erasing/writing operations are made of doped polysilicon. During the ETOX operation, in order to prevent the problem of data error due to over-erasing/writing phenomenon, a select transistor is serially connected at one side of the memory cell to form a two-transistor (2T) structure. When multiple-time programming (MTP) is performed, the programming and reading operations of the memory cell can be controlled by the select transistor.

With the development of a multi-functional chip, a memory unit in a cell area as well as a logic device, a resistor, or a capacitor in a periphery area may be formed on the same chip. However, the process of manufacturing the memory unit is often separated from the process of manufacturing the peripheral device; hence, several photo masks may be required, and the manufacturing processes are rather complicated. This may increase the manufacturing costs and weaken the competitiveness.

SUMMARY OF THE INVENTION

The invention is directed to a method of forming a semiconductor structure. According to the method, a memory unit may be easily integrated with a peripheral logic device, a resistor, or a capacitor through an existing manufacturing process.

In an embodiment of the invention, a method of forming a semiconductor structure is provided. A substrate having a cell area and a logic circuit area is provided. An oxide material layer and a first conductive material layer are sequentially formed on the substrate in the cell area and in the logic circuit area. A patterning step is performed to form a first stacked structure on the substrate in the cell area and form a second stacked structure on the substrate in the logic circuit area. A first spacer is formed on a sidewall of the first stacked structure, and a second spacer is formed on a sidewall of the second stacked structure. At least two first doped regions are formed in the substrate beside the first stacked structure, and two second doped regions are formed in the substrate beside the second stacked structure. A dielectric layer and a second conductive layer are formed at least on the first stacked structure. The first stacked structure, the dielectric layer, and the second conductive layer in the cell area constitute a charge storage structure, and the second stacked structure is a logic transistor.

According to an embodiment of the invention, a select transistor is simultaneously formed at one side of the first stacked structure on the substrate in the cell area in the patterning step. A third spacer is simultaneously formed on a sidewall of the select transistor in the step of forming the first and second spacers. The first doped regions are further formed in the substrate beside the select transistor, and the charge storage structure and the select transistor share one of the first doped regions.

According to an embodiment of the invention, the dielectric layer has a single-layer structure or a multi-layer structure.

According to an embodiment of the invention, the dielectric layer and the second conductive layer further extend, along the sidewall of the first stacked structure, to the substrate at one side of the first stacked structure in the cell area, and the first doped regions are respectively disposed in the substrate beside the second conductive layer.

According to an embodiment of the invention, the dielectric layer has a single-layer structure.

According to an embodiment of the invention, the substrate further has a resistor area.

According to an embodiment of the invention, a third stacked structure is simultaneously formed on the substrate in the resistor area in the patterning step. A third spacer is simultaneously formed on a sidewall of the third stacked structure in the step of forming the first and second spacers. The dielectric layer and the second conductive layer are further formed on the third stacked structure and expose a portion of an upper surface of the third stacked structure.

According to an embodiment of the invention, the method of forming the semiconductor structure further includes: forming a fourth spacer on a sidewall of the charge storage structure, forming a fifth spacer on the sidewall of the second stacked structure, forming a sixth spacer on sidewalls of the dielectric layer and the second conductive layer on the third stacked structure, and forming a silicide layer at least on an upper surface of the charge storage structure, on an upper surface of the second stacked structure, on the portion of the upper surface of the third stacked structure, and on an upper surface of the second conductive layer on the third stacked structure.

According to an embodiment of the invention, a material of the silicide layer includes cobalt silicide.

According to an embodiment of the invention, the method of forming the semiconductor structure further includes forming two conductive plugs that are electrically connected to the silicide layer on the third stacked structure.

According to an embodiment of the invention, the dielectric layer and the second conductive layer are further formed on the substrate in the resistor area to constitute a third stacked structure.

According to an embodiment of the invention, the method of forming the semiconductor structure further includes: forming a third spacer on a sidewall of the charge storage structure, forming a fourth spacer on the sidewall of the second stacked structure, forming a fifth spacer on a sidewall of the third stacked structure, and forming a silicide layer at least on an upper surface of the charge storage structure, on an upper surface of the second stacked structure, and on an upper surface of the third stacked structure.

According to an embodiment of the invention, a material of the silicide layer includes cobalt silicide.

According to an embodiment of the invention, the silicide layer is further formed on the substrate beside the third stacked structure.

According to an embodiment of the invention, the method of forming the semiconductor structure further includes forming two conductive plugs that are electrically connected to the silicide layer located on the substrate beside the third stacked structure.

According to an embodiment of the invention, the substrate further has a capacitor area.

According to an embodiment of the invention, a third stacked structure is simultaneously formed on the substrate in the capacitor area in the patterning step. A third spacer is simultaneously formed on a sidewall of the third stacked structure in the step of forming the first and second spacers. The dielectric layer and the second conductive layer are further formed on the third stacked structure, and a sidewall of the dielectric layer and a sidewall of the second conductive layer are aligned to the sidewall of the third stacked structure. The third stacked structure, the dielectric layer, and the second conductive layer in the capacitor area constitute a capacitor.

According to an embodiment of the invention, the method of forming the semiconductor structure further includes forming a fourth spacer on a sidewall of the charge storage structure, forming a fifth spacer on the sidewall of the second stacked structure, and forming a sixth spacer on a sidewall of the capacitor.

According to an embodiment of the invention, two third doped regions are simultaneously formed in the substrate beside the capacitor in the step of forming the first doped regions and the second doped regions.

In view of the above, the method of forming the semiconductor structure described herein may be integrated into the existing manufacturing process (e.g., a logic manufacturing process or a CMOS manufacturing process). Thereby, a memory unit may be easily integrated with a peripheral logic device, a resistor, or a capacitor through the existing manufacturing process, which significantly reduces the manufacturing costs and enhances competitiveness. Here, the memory unit may have an ETOX structure or a two-transistor (2T) structure including a charge storage structure and a select transistor, and a one-time programming (OTP) operation or a multi-time programming (MTP) operation may be performed based on actual requirements.

Several exemplary embodiments accompanied with figures are described in detail below to further explain the invention.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the invention.

DETAILED DESCRIPTION OF DISCLOSED EXEMPLARY EMBODIMENTS

First Embodiment

FIG. 1A through FIG. 1E are schematic cross-sectional views illustrating a method of forming a semiconductor structure according to a first embodiment of the invention.

Figure 1A:
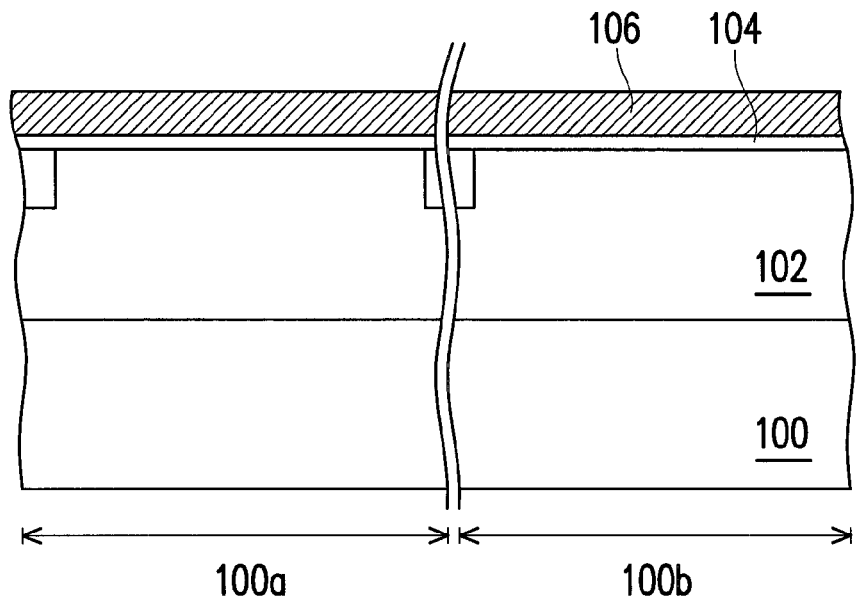
FIG. 1A through FIG. 1E are schematic cross-sectional views illustrating a method of forming a semiconductor structure according to a first embodiment of the invention.

With reference to FIG. 1A, a substrate 100 is provided. The substrate 100 is, for instance, a p-type silicon substrate. A well region 102 is formed in the substrate 100. The well region 102 is, for instance, a p-type well region. According to an embodiment, a deep well region (not shown) may be selectively formed in the substrate 100 and located below the well region 102. In the present embodiment, the substrate 100 has a cell area 100a and a first periphery area 100b. The first periphery area 100b is, for example, a logic circuit area. Besides, a plurality of shallow trench isolation (STI) structures may be formed in the substrate 100, and the cell area 100a and the first periphery area 100b may be separated from each other via the STI structures.

An oxide material layer 104 and a conductive material layer 106 are sequentially formed on the substrate 100 in the cell area 100a and in the first periphery area 100b. A material of the oxide material layer 104 is, for instance, silicon oxide, and a method of forming the oxide material layer 104 includes thermal oxidation. A material of the conductive material layer 106 is, for instance, doped polysilicon, and a method of forming the conductive material layer 106 includes chemical vapor deposition (CVD).

Figure 1B:
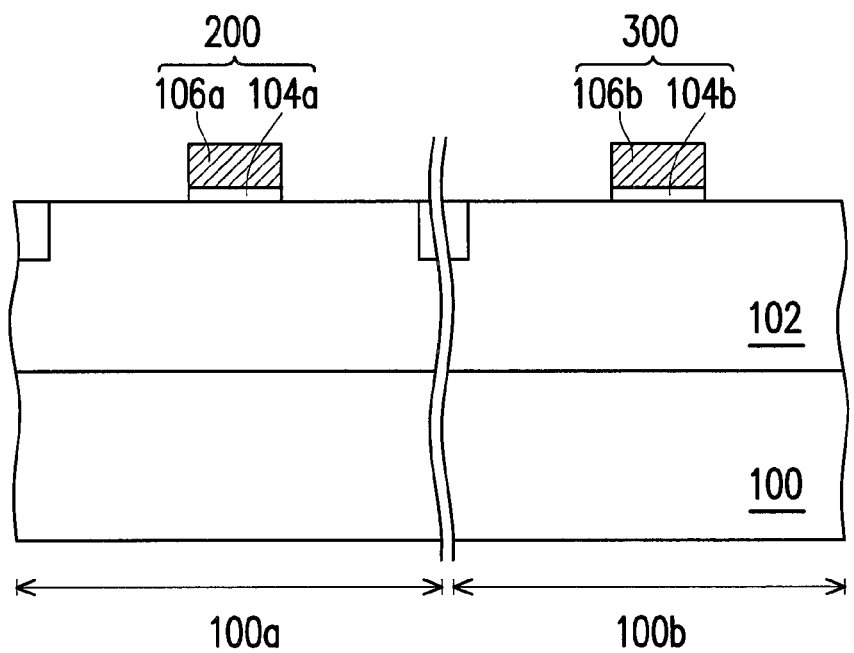

With reference to FIG. 1B, a patterning step is performed to pattern the oxide material layer 104 and the conductive material layer 106; thereby, a stacked structure 200 is formed on the substrate 100 in the cell area 100a, and a stacked structure 300 is formed on the substrate 100 in the first periphery area 100b. The stacked structure 200 includes an oxide layer 104a and a conductive layer 106a that are sequentially arranged on the substrate 100. The stacked structure 300 includes an oxide layer 104b and a conductive layer 106b that are sequentially arranged on the substrate 100. Materials and thicknesses of the oxide layers 104a and 104b are the same, and materials and thicknesses of the conductive layers 106a and 106b are the same. These four layers may be formed in the same patterning step.

Figure 1C:
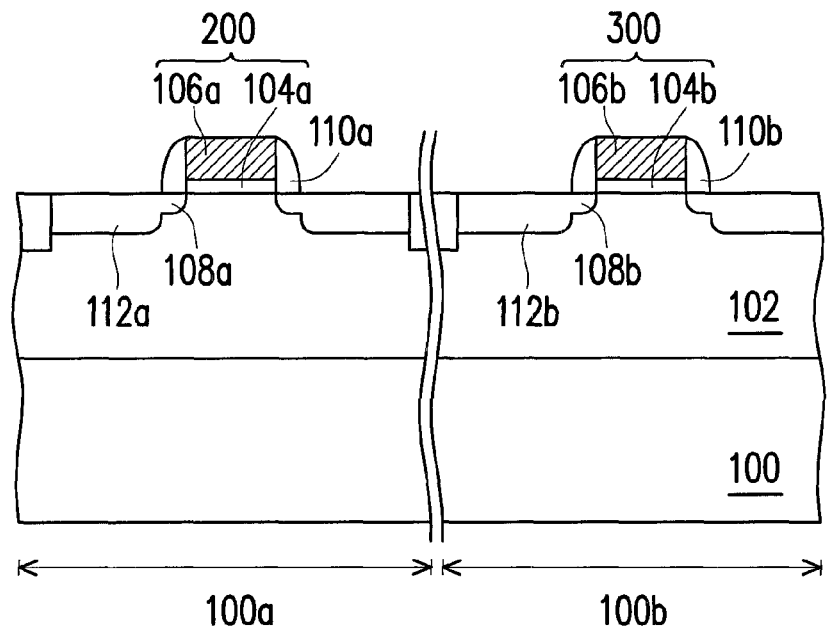

With reference to FIG. 1C, two lightly doped regions 108a are formed in the substrate 100 beside the stacked structure 200, and two lightly doped regions 108b are formed in the substrate 100 beside the stacked structure 300. The lightly doped regions 108a and 108b are, for instance, n-type lightly doped regions, and a method of forming the lightly doped regions 108a and 108b includes ion implantation. A spacer 110a is formed on a sidewall of the stacked structure 200, and a spacer 110b is formed on a sidewall of the stacked structure 300. The spacers 110a and 110b are made of silicon oxide, silicon nitride, or silicon oxynitride, for instance, and a method of forming the spacers 110a and 110b includes performing a CVD process and then an anisotropic etching process. After that, two doped regions 112a are formed in the substrate 100 beside the stacked structure 200, and two doped regions 112b are formed in the substrate 100 beside the stacked structure 300. The doped regions 112a and 112b are, for instance, n-type doped regions, and a method of forming the doped regions 112a and 112b includes ion implantation.

Figure 1D:
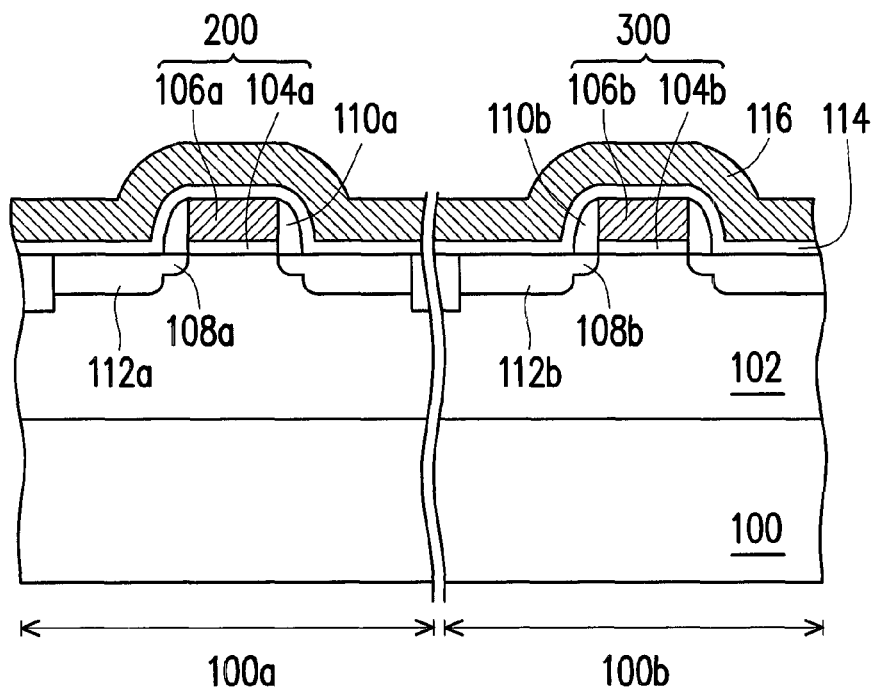

With reference to FIG. 1D, a dielectric material layer 114 and a conductive material layer 116 are sequentially formed on the substrate 100 to cover the stacked structures 200 and 300. In an embodiment, the dielectric material layer 114 may have a single-layer structure, e.g., a silicon oxide layer. In another embodiment, the dielectric material layer 114 may have a multi-layer structure, e.g., a silicon oxide-silicon nitride-silicon oxide (ONO) composite layer. The dielectric material layer 114 exemplarily shown in FIG. 1D has a single-layer structure. A method of forming the dielectric material layer 114 includes CVD. A material of the conductive material layer 116 is, for instance, doped polysilicon, and a method of forming the conductive material layer 106 includes CVD.

Figure 1E:
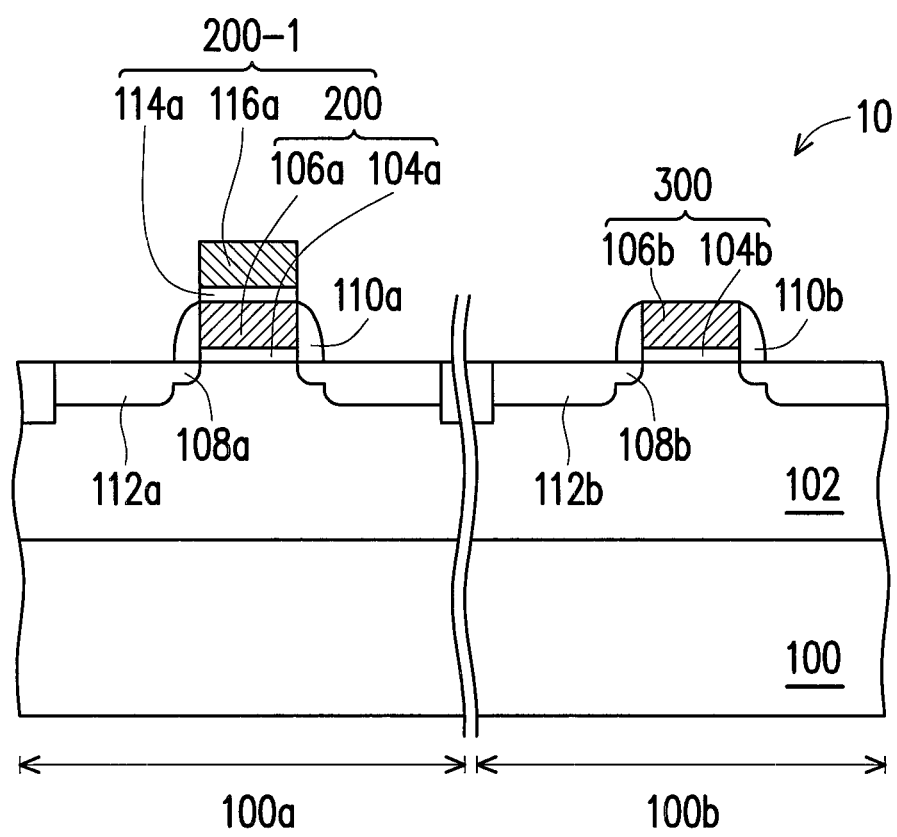

With reference to FIG. 1E, a patterning step is performed to pattern the dielectric material layer 114 and the conductive material layer 116, and thereby a dielectric layer 114a and a conductive layer 116a are formed on the stacked structure 200. The stacked structure 200 (including the oxide layer 104a and the conductive layer 106a), the dielectric layer 114a, and the conductive layer 116a in the cell area 100a constitute a charge storage structure 200-1. The oxide layer 104a may serve as a gate oxide layer. The conductive layer 106a may serve as a floating gate. The dielectric layer 114a may serve as an inter-gate dielectric layer. The conductive layer 116a may serve as a control gate. Besides, when the first periphery area 100b is a logic circuit area, for instance, the stacked structure 300 (including the oxide layer 104b and the conductive layer 106b) is a logic transistor, for instance. The oxide layer 104a may serve as a gate oxide layer of the logic transistor. The conductive layer 106b may serve as a gate of the logic transistor.

In the semiconductor structure 10 described in the first embodiment, the gate oxide layer (i.e., the oxide layer 104a) and the floating gate (i.e., the conductive layer 106a) in the cell area 100a and the logic gate oxide layer (i.e., the oxide layer 104b) and the logic gate (i.e., the conductive layer 106b) in the logic circuit area (i.e., the first periphery area 100b) may be formed in the same patterning step. Hence, the manufacturing process may be simplified, the manufacturing costs may be reduced, and competitiveness may be enhanced.

In the first embodiment, only a charge storage structure is exemplarily formed in the cell area, which should however not be construed as a limitation to the invention. In another embodiment of the invention, a two-transistor (2T) structure including a charge storage structure and a select transistor may be formed in the cell area. This will be elaborated in the second embodiment below.

Second Embodiment

FIG. 2A through FIG. 2E are schematic cross-sectional views illustrating a method of forming a semiconductor structure according to a second embodiment of the invention. The same reference numbers used in the first and second embodiments represent the same or similar components; descriptions of the materials and the forming methods of these components may be referred to as those provided in the first embodiment and will not be given hereinafter.

Figure 2A:
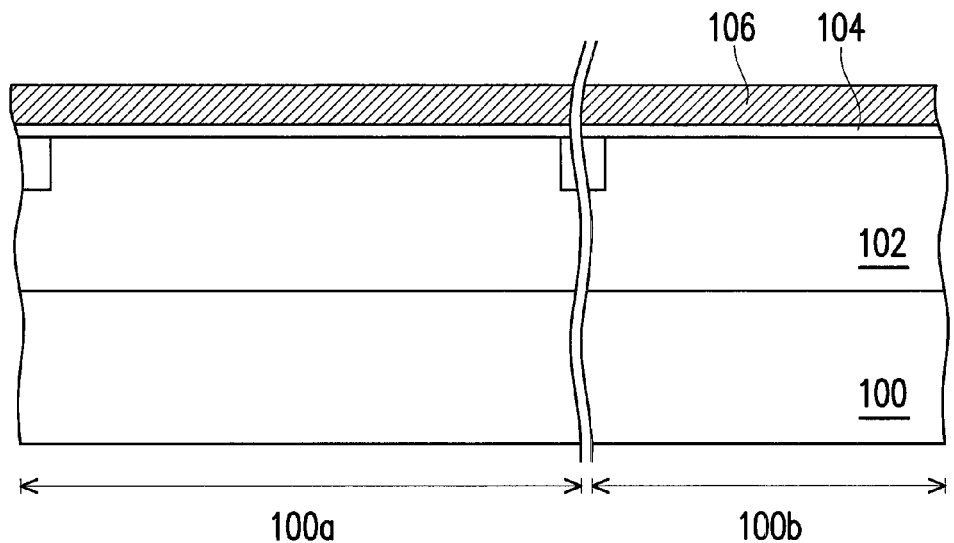
FIG. 2A through FIG. 2E are schematic cross-sectional views illustrating a method of forming a semiconductor structure according to a second embodiment of the invention.
Figure 2B:
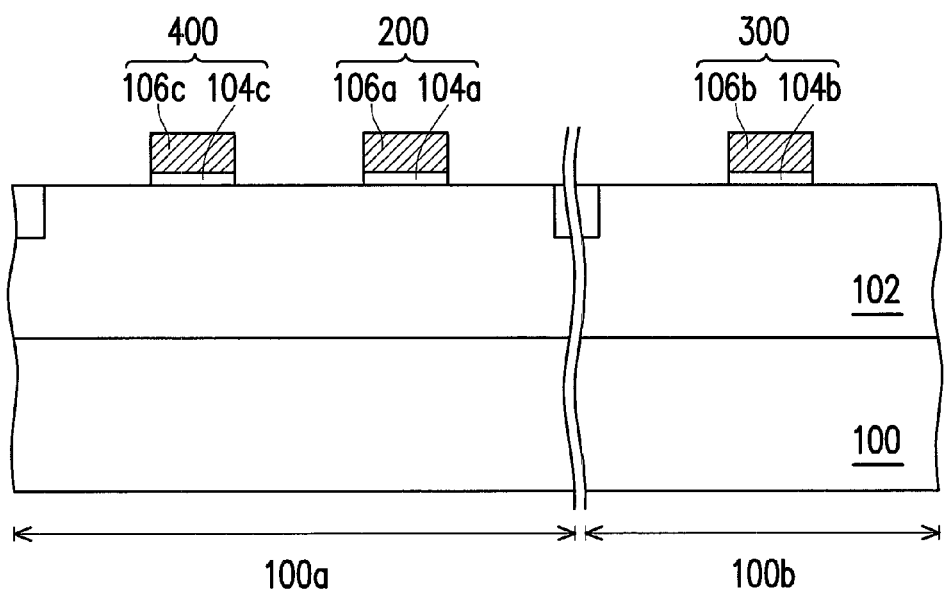

With reference to FIG. 2A, the structure shown in FIG. 1A is provided. With reference to FIG. 2B, a patterning step is performed to pattern the oxide material layer 104 and the conductive material layer 106; thereby, a stacked structure 200 and a stacked structure 400 are formed on the substrate 100 in the cell area 100a, and a stacked structure 300 is formed on the substrate 100 in the first periphery area 100b. The stacked structure 200 includes an oxide layer 104a and a conductive layer 106a that are sequentially arranged on the substrate 100. The stacked structure 300 includes an oxide layer 104b and a conductive layer 106b that are sequentially arranged on the substrate 100. The stacked structure 400 includes an oxide layer 104c and a conductive layer 106c that are sequentially arranged on the substrate 100. It should be mentioned that materials and thicknesses of the oxide layers 104a, 104b, and 104c are the same, and materials and thicknesses of the conductive layers 106a, 106b, and 106c are the same. These layers may be formed in the same patterning process.

Figure 2C:
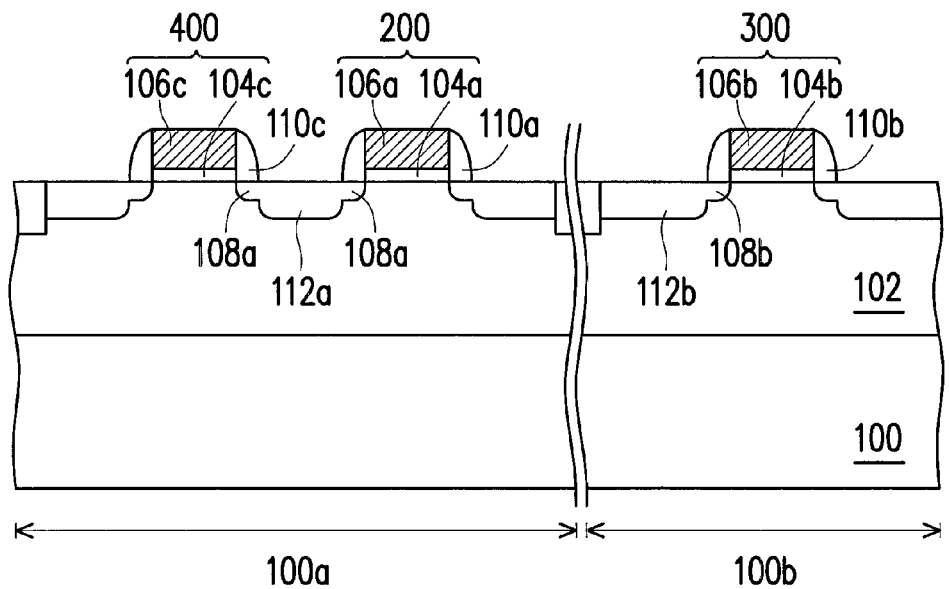

With reference to FIG. 2C, at least two lightly doped regions 108a are formed in the substrate 100 beside the stacked structure 200, and two lightly doped regions 108b are formed in the substrate 100 beside the stacked structure 300. Lightly doped regions 108a may be further formed in the substrate 100 beside the stacked structure 400. A spacer 110a is formed on a sidewall of the stacked structure 200, a spacer 110b is formed on a sidewall of the stacked structure 300, and a spacer 110c is formed on a sidewall of the stacked structure 400. After that, at least two doped regions 112a are formed in the substrate 100 beside the stacked structure 200, and two doped regions 112b are formed in the substrate 100 beside the stacked structure 300. Doped regions 112a may be further formed in the substrate 100 beside the stacked structure 400. The stacked structure 200 (or a subsequently formed charge storage structure 200-1) and the stacked structure 400 (i.e., the select transistor) share one doped region 112a.

Figure 2D:
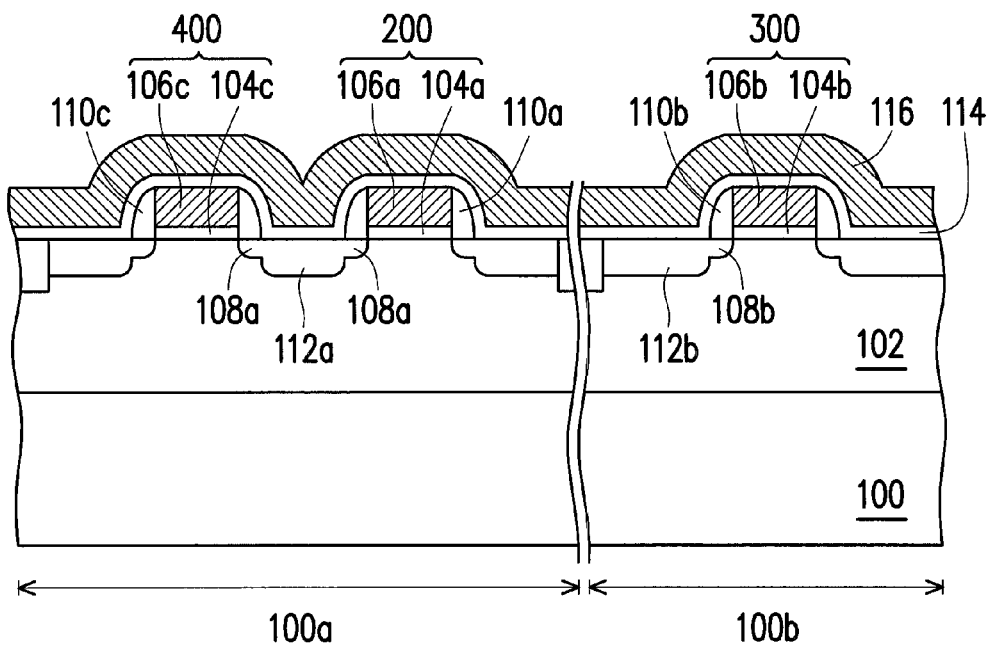

With reference to FIG. 2D, a dielectric material layer 114 and a conductive material layer 116 are sequentially formed on the substrate 100 to cover the stacked structures 200, 300, and 400. The dielectric material layer 114 may have a single-layer structure or a multi-layer structure.

Figure 2E:
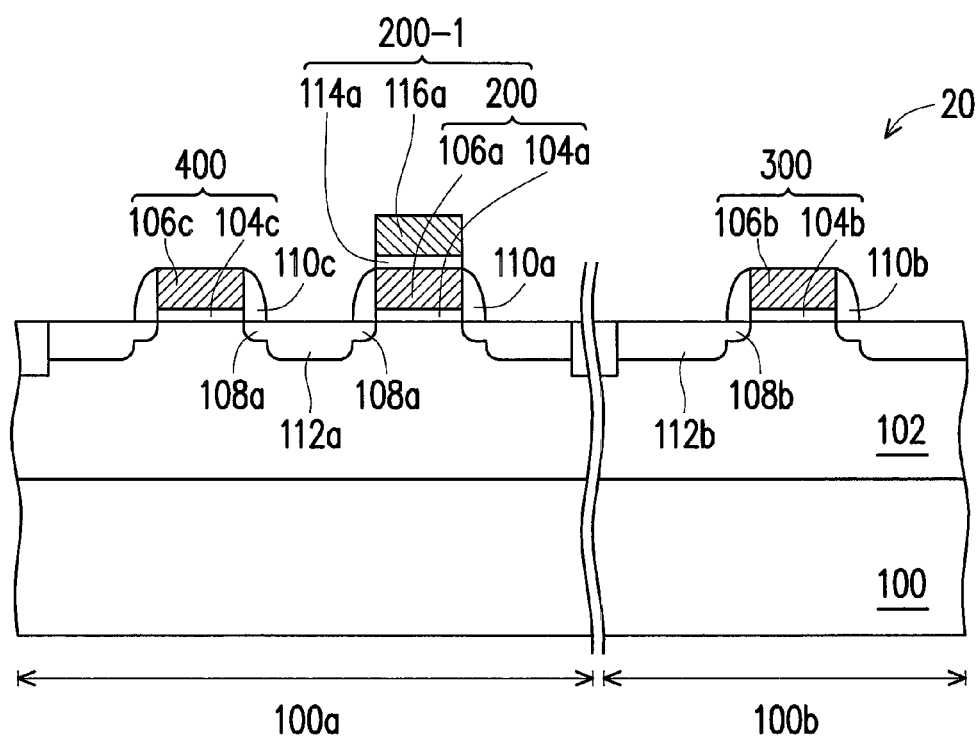

With reference to FIG. 2E, a patterning step is performed to pattern the dielectric material layer 114 and the conductive material layer 116, and thereby a dielectric layer 114a and a conductive layer 116a are formed on the stacked structure 200. The stacked structure 200 (including the oxide layer 104a and the conductive layer 106a), the dielectric layer 114a, and the conductive layer 116a in the cell area 100a constitute a charge storage structure 200-1. The oxide layer 104a may serve as a gate oxide layer. The conductive layer 106a may serve as a floating gate. The dielectric layer 114a may serve as an inter-gate dielectric layer. The conductive layer 116a may serve as a control gate. The stacked structure 400 (including the oxide layer 104c and the conductive layer 106c) in the cell area 100a is a select transistor, for instance. The oxide layer 104c may serve as a select gate oxide layer. The conductive layer 106c may serve as a select gate. Besides, when the first periphery area 100b is a logic circuit area, for instance, the stacked structure 300 (including the oxide layer 104b and the conductive layer 106b) is a logic transistor, for instance. The oxide layer 104b may serve as a logic gate oxide layer. The conductive layer 106b may serve as a logic gate.

In the semiconductor structure 20 described in the second embodiment, the gate oxide layer (i.e., the oxide layer 104a), the floating gate (i.e., the conductive layer 106a), the select gate oxide layer (i.e., the oxide layer 104c), and the select gate (i.e., the conductive layer 106c) in the cell area 100a and the logic gate oxide layer (i.e., the oxide layer 104b) and the logic gate (i.e., the conductive layer 106b) in the logic circuit area (i.e., the first periphery area 100b) may be formed in the same patterning step. Hence, the manufacturing process may be simplified, the manufacturing costs may be reduced, and competitiveness may be enhanced.

In the second embodiment, the charge storage structure and the select transistor in the cell area are separated from each other, which should however not be construed as a limitation to the invention. In another embodiment of the invention, the charge storage structure and the select transistor in the cell area may be one continuous structure. This will be elaborated in the third embodiment below.

Third Embodiment

Figure 3A:
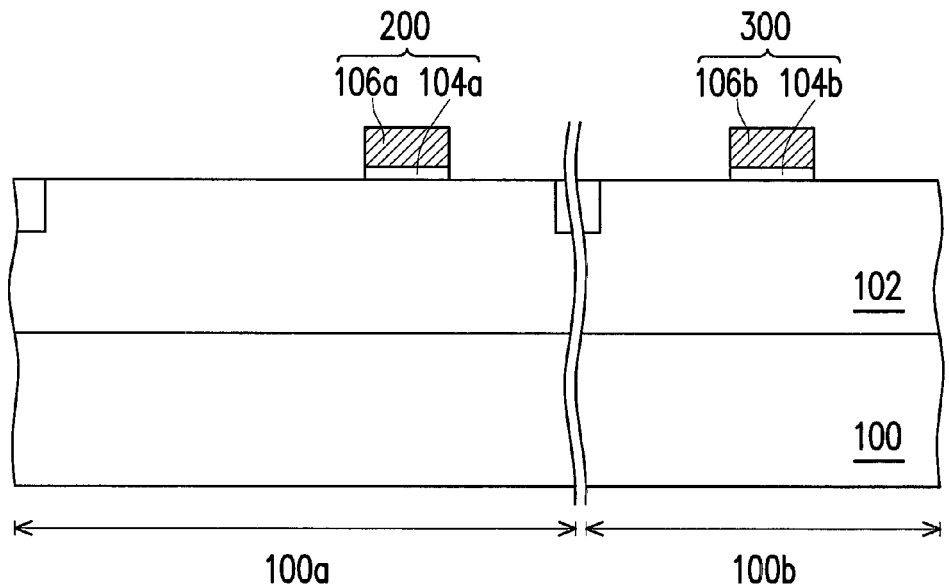
FIG. 3A through FIG. 3C are schematic cross-sectional views illustrating a method of forming a semiconductor structure according to a third embodiment of the invention.
Figure 3B:
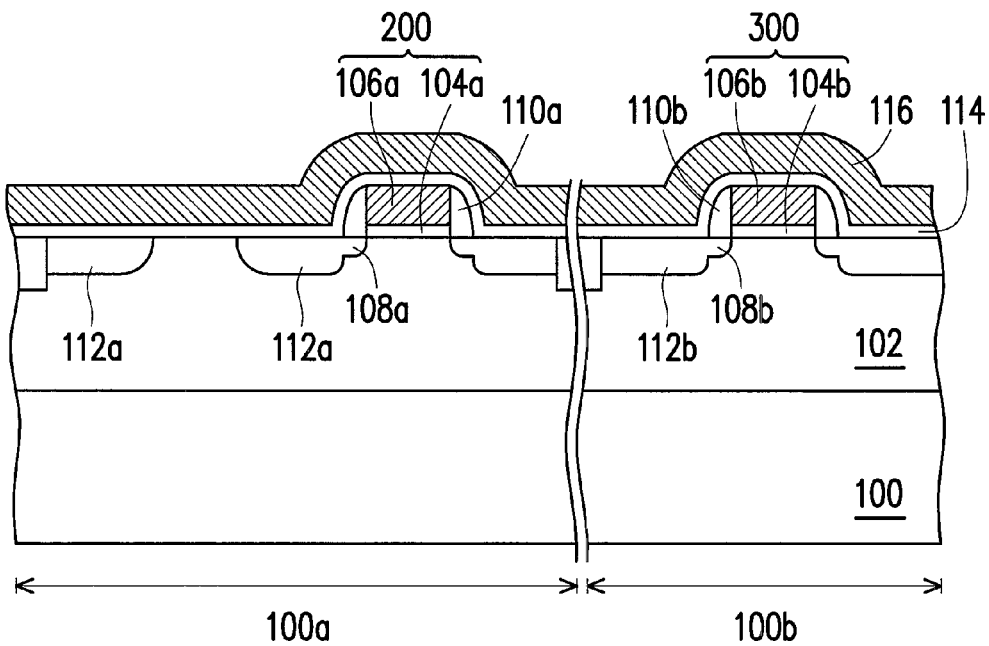
Figure 3C:
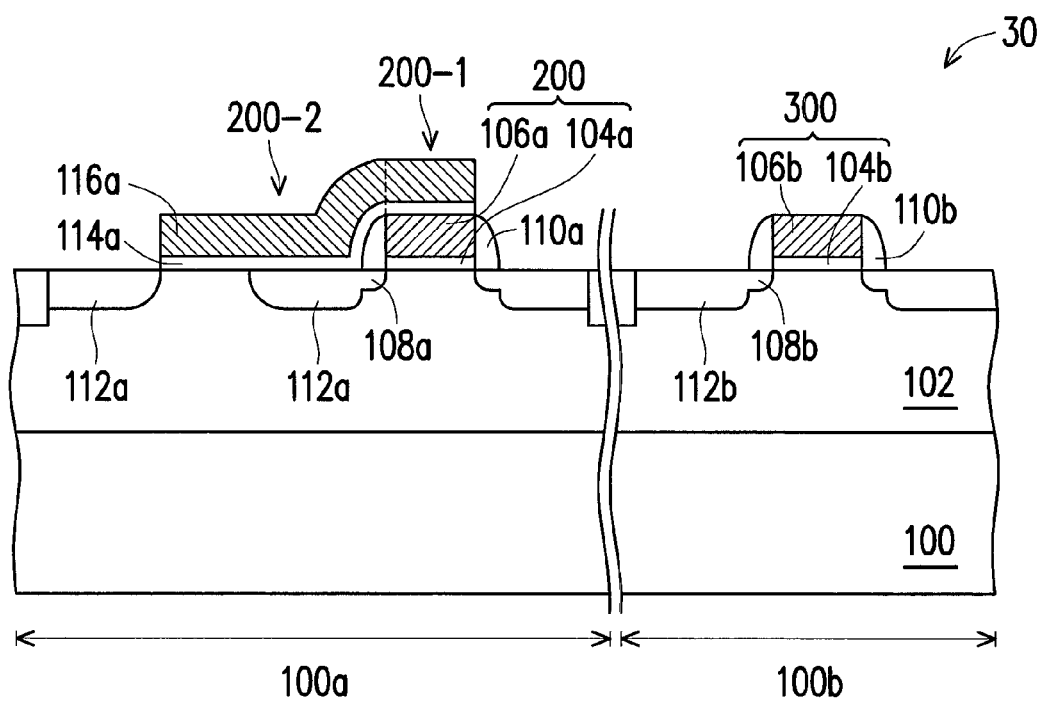

FIG. 3A through FIG. 3C are schematic cross-sectional views illustrating a method of forming a semiconductor structure according to a third embodiment of the invention. The same reference numbers used in the first and third embodiments represent the same or similar components; descriptions of the materials and the forming methods of these components may be referred to as those provided in the first embodiment and will not be given hereinafter.

With reference to FIG. 3A, the structure shown in FIG. 1B is provided. With reference to FIG. 3B, two light doped regions 108a are formed in the substrate 100 beside the stacked structure 200, and two light doped regions 108b are formed in the substrate 100 beside the stacked structure 300. A spacer 110a is formed on a sidewall of the stacked structure 200, and a spacer 110b is formed on a sidewall of the stacked structure 300. After that, at least two doped regions 112a are formed in the substrate 100 beside the stacked structure 200, and two doped regions 112b are formed in the substrate 100 beside the stacked structure 300. Note that one doped region 112a is located in the substrate 100 adjoining one side of the stacked structure 200 (i.e., on the right side of the cell area 100a shown in FIG. 3B), one doped region 112a is located in the substrate 100 and is at a distance from the stacked structure 200 (i.e., on the left side of the cell area 100b shown in FIG. 3B), and one doped region 112a may be selectively disposed between said two doped regions 112a and located in the substrate adjoining the other side of the stacked structure 200 (i.e., in the middle of the cell area 100a shown in FIG. 3B). A dielectric material layer 114 and a conductive material layer 116 are sequentially formed on the substrate 100 to cover the stacked structures 200 and 300.

With reference to FIG. 3C, a patterning step is performed to pattern the dielectric material layer 114 and the conductive material layer 116, so as to at least form a dielectric layer 114a and a conductive layer 116a on the stacked structure 200. In the present embodiment, the dielectric layer 114a and the conductive layer 116a further extend, along the sidewall of the stacked structure 200, to the substrate 100 at one side of the stacked structure 200 in the cell area 100a.

In FIG. 3C, two doped regions 112a are disposed in the substrate 100 beside the conductive layer 116a, and a borderline of one of the doped regions 112a (on the left side of the cell area 100a shown in FIG. 3C) is aligned to but is not overlapped with a borderline of the conductive layer 116a. Nevertheless, the invention should not be construed as limited to the embodiment set forth herein. In another embodiment, the doped region 112a is partially overlapped with the conductive layer 116a. In still another embodiment, the borderline of the doped region 112a is separated from and is not overlapped with the borderline of the conductive layer 116a. In addition, one of the doped regions 112a (in the middle of the cell area 100a shown in FIG. 3B) may be selectively disposed between said two doped regions 112a and located in the substrate 100 below the conductive layer 116a.

According to the present embodiment, in the cell area 100a, the stacked structure 200 (including the oxide layer 104a and the conductive layer 106a), the dielectric layer 114a on the stacked structure 200, and the conductive layer 116a on the stacked structure 200 constitute a charge storage structure 200-1. The oxide layer 104a may serve as a gate oxide layer. The conductive layer 106a may serve as a floating gate. The dielectric layer 114a on the stacked structure 200 may serve as an inter-gate dielectric layer. The dielectric layer 116a on the stacked structure 200 may serve as a control gate. Besides, in the cell area 100a, the dielectric layer 114a and the conductive layer 116a at one side of the stacked structure 200 on the substrate 100 constitute a select transistor 200-2. Namely, the select transistor 200-2 is directly located on the substrate 100. The dielectric layer 114a on the substrate 100 may serve as a select gate oxide layer. The conductive layer 116a on the substrate 100 may serve as a select gate. Besides, when the first periphery area 100b is a logic circuit area, for instance, the stacked structure 300 (including the oxide layer 104b and the conductive layer 106b) is a logic transistor, for instance. The oxide layer 104b may serve as a logic gate oxide layer. The conductive layer 106b may serve as a logic gate.

In the semiconductor structure 30 described in the third embodiment, the gate oxide layer (i.e., the oxide layer 104a) and the floating gate (i.e., the conductive layer 106a) in the cell area 100a and the logic gate oxide layer (i.e., the oxide layer 104b) and the logic gate (i.e., the conductive layer 106b) in the logic circuit area (i.e., the first periphery area 100b) may be formed in the same patterning step. Hence, the manufacturing process may be simplified, the manufacturing costs may be reduced, and competitiveness may be enhanced.

In addition, in the cell area 100a, the inter-gate dielectric layer and the select gate oxide layer (i.e., the dielectric layer 114a) as well as the control gate and the select gate (i.e., the conductive layer 116a) may also be formed in the same patterning step. Note that a portion of the dielectric layer 114a extends to the substrate 100 at one side of the stacked structure 200 and serves as a select gate oxide layer in the present embodiment, and therefore the dielectric layer 114 preferably has a single-layer structure. Moreover, the conductive layer 116a described in the present embodiment may function as a control gate and a select gate. That is, in the third embodiment, the control gate and the select gate may be driven together.

In the first embodiment to the third embodiment, the periphery area exemplarily serves as a logic circuit area, which should however not be construed as a limitation to the invention. According to another embodiment, the periphery area may also have a logic circuit area and a resistor area. This will be elaborated in the fourth and fifth embodiments below.

Fourth Embodiment

FIG. 4A through FIG. 4F are schematic cross-sectional views illustrating a method of forming a semiconductor structure according to a fourth embodiment of the invention. The same reference numbers used in the first and fourth embodiments represent the same or similar components; descriptions of the materials and the forming methods of these components may be referred to as those provided in the first embodiment and will not be given hereinafter.

Figure 4A:
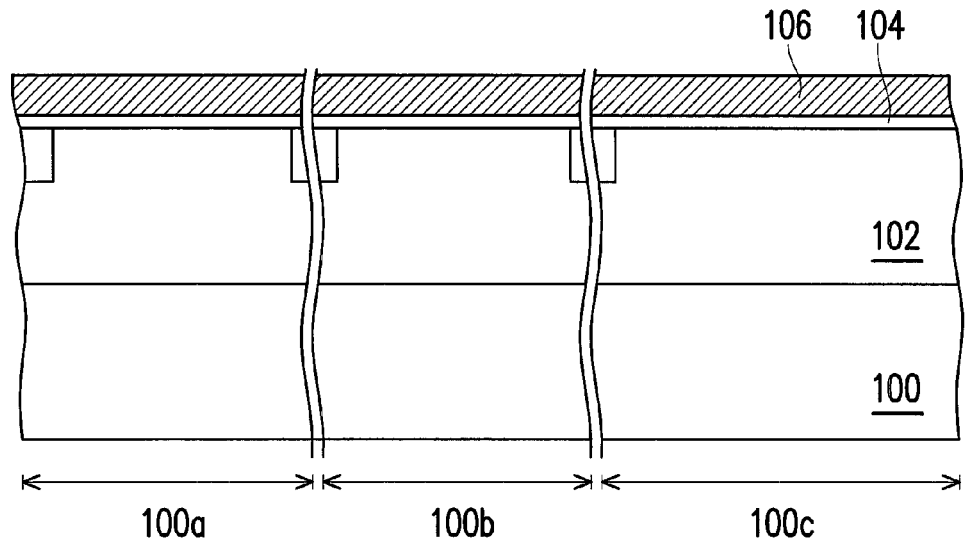
FIG. 4A through FIG. 4F are schematic cross-sectional views illustrating a method of forming a semiconductor structure according to a fourth embodiment of the invention.

As shown in FIG. 4A, a substrate 100 is provided. A well region 102 is formed in the substrate 100. Here, a deep well region (not shown) may be selectively formed in the substrate 100 and located below the well region 102. In the present embodiment, the substrate 100 has a cell area 100a, a first periphery area 100b, and a second periphery area 100c. The first periphery area 100b is, for instance, a logic circuit area, and the second periphery area 100c is, for instance, a resistor area. In addition, the cell area 100a, the first periphery area 100b, and the second periphery area 100c may be separated from one another via the STI structures. An oxide material layer 104 and a conductive material layer 106 are sequentially formed on the substrate 100 in the cell area 100a, in the first periphery area 100b, and in the second periphery area 100c.

Figure 4B:
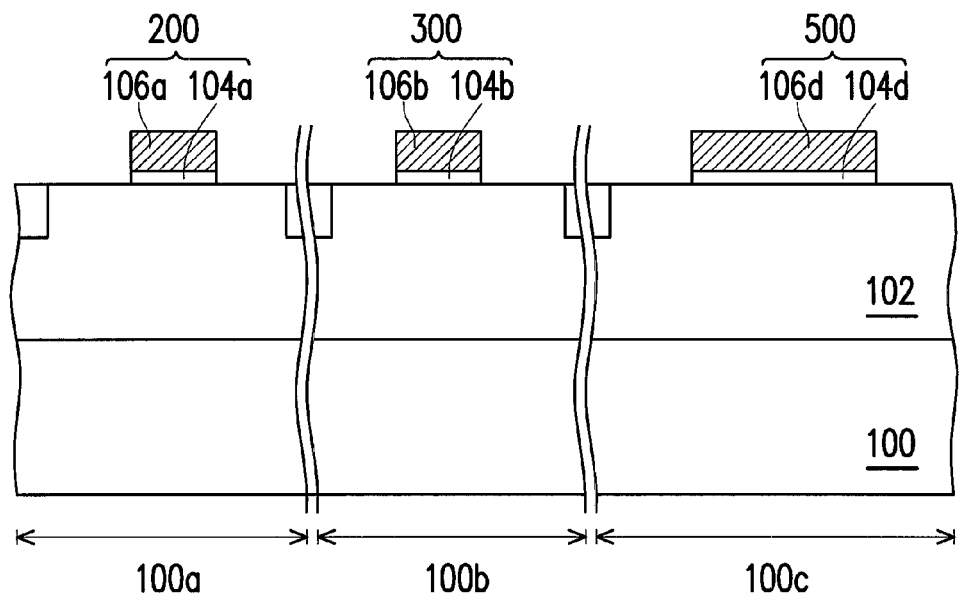

With reference to FIG. 4B, a patterning step is performed to pattern the oxide material layer 104 and the conductive material layer 106; thereby, a stacked structure 200 is formed on the substrate 100 in the cell area 100a, a stacked structure 300 is formed on the substrate 100 in the first periphery area 100b, and a stacked structure 500 is formed on the substrate 100 in the second periphery area 100c. The stacked structure 200 includes an oxide layer 104a and a conductive layer 106a that are sequentially arranged on the substrate 100. The stacked structure 300 includes an oxide layer 104b and a conductive layer 106b that are sequentially arranged on the substrate 100. The stacked structure 500 includes an oxide layer 104d and a conductive layer 106d that are sequentially arranged on the substrate 100. It should be mentioned that materials and thicknesses of the oxide layers 104a, 104b, and 104d are the same, and materials and thicknesses of the conductive layers 106a, 106b, and 106d are the same. These layers may be formed in the same patterning process.

Figure 4C:
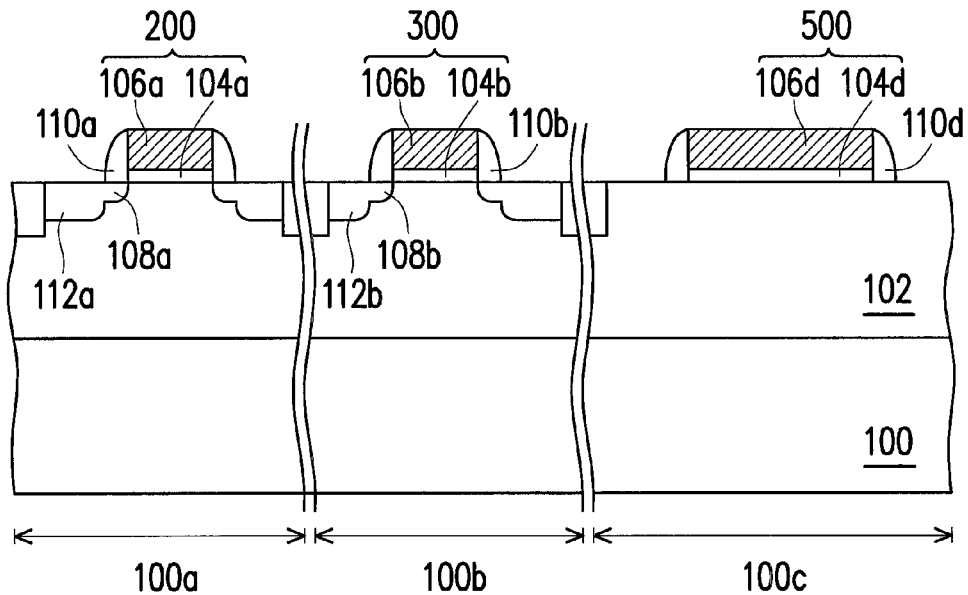

With reference to FIG. 4C, two light doped regions 108a are formed in the substrate 100 beside the stacked structure 200, and two light doped regions 108b are formed in the substrate 100 beside the stacked structure 300. According to an embodiment, two light doped regions (not shown) may be selectively formed in the substrate 100 beside the stacked structure 500. A spacer 110a is formed on a sidewall of the stacked structure 200, a spacer 110b is formed on a sidewall of the stacked structure 300, and a spacer 110d is formed on a sidewall of the stacked structure 500. The spacers 110a, 110b, and 110d may be formed in the same manufacturing step. After that, two doped regions 112a are formed in the substrate 100 beside the stacked structure 200, and two doped regions 112b are formed in the substrate 100 beside the stacked structure 300. According to an embodiment, two doped regions (not shown) may be selectively formed in the substrate 100 beside the stacked structure 500.

Figure 4D:
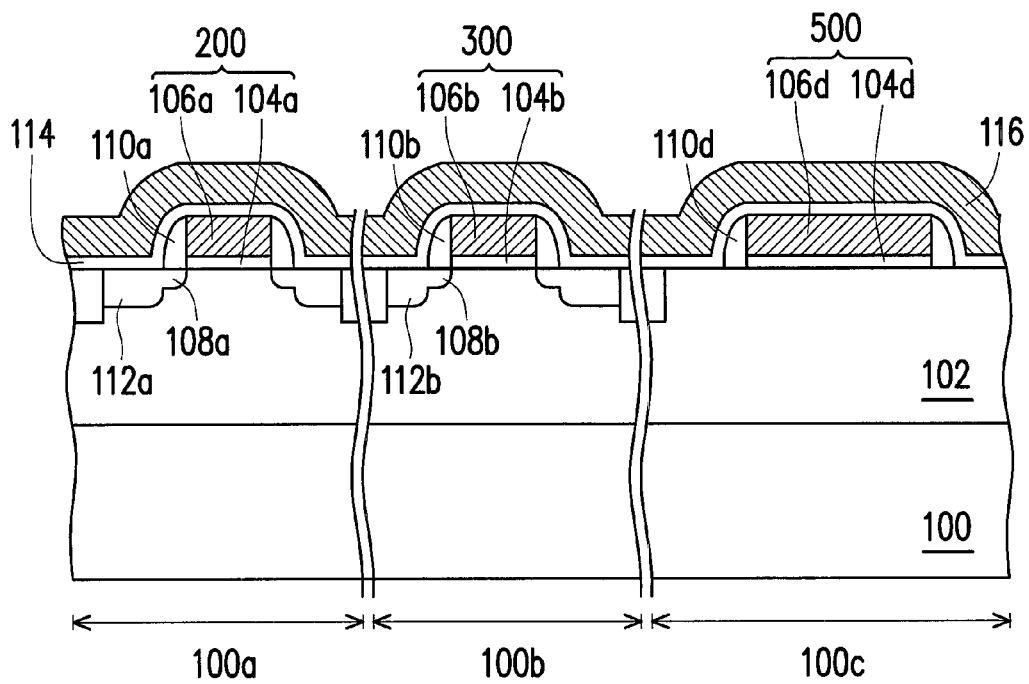

With reference to FIG. 4D, a dielectric material layer 114 and a conductive material layer 116 are sequentially formed on the substrate 100 to cover the stacked structures 200, 300, and 500. The dielectric material layer 114 may have a single-layer structure or a multi-layer structure.

Figure 4E:
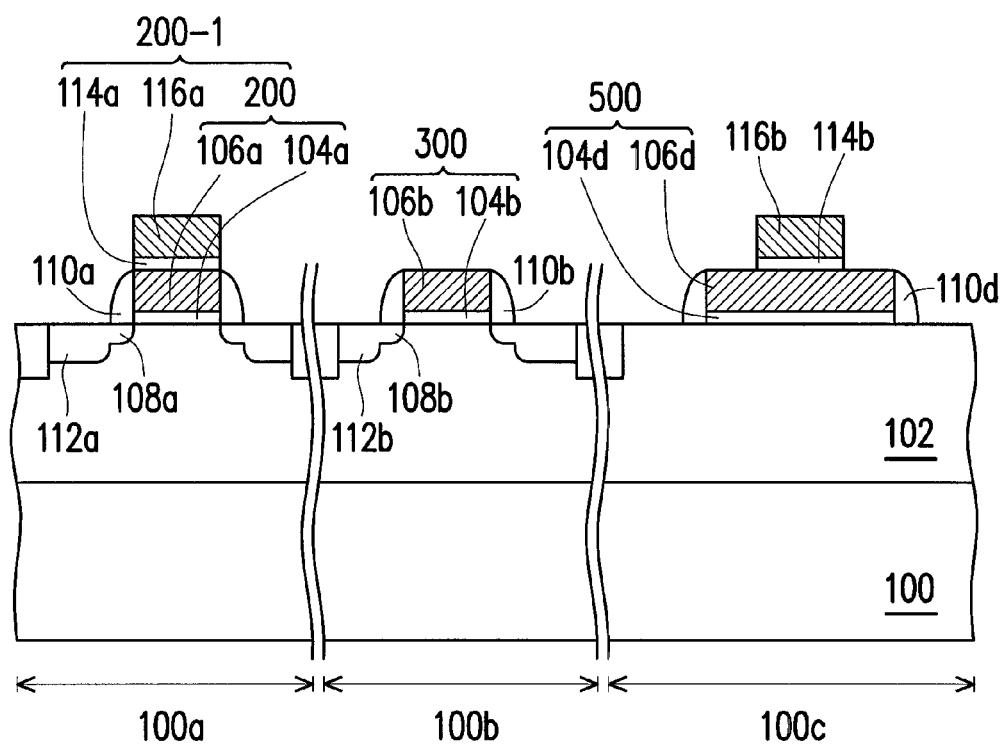

With reference to FIG. 4E, a patterning step is performed to pattern the dielectric material layer 114 and the conductive material layer 116, so as to form a dielectric layer 114a and a conductive layer 116a on the stacked structure 200 and form a dielectric layer 114b and a conductive layer 116b on the stacked structure 500. The stacked structure 200, the dielectric layer 114a, and the conductive layer 116a in the cell area 100a constitute a charge storage structure 200-1. Besides, when the first periphery area 100b is a logic circuit area, for instance, the stacked structure 300 is a logic transistor, for instance. According to the present embodiment, a sidewall of the dielectric layer 114a and a sidewall of the conductive layer 116a are aligned to the sidewall of the stacked structure 200, and the dielectric layer 114b and the conductive layer 116b expose a portion of the upper surface of the stacked structure 500.

Figure 4F:
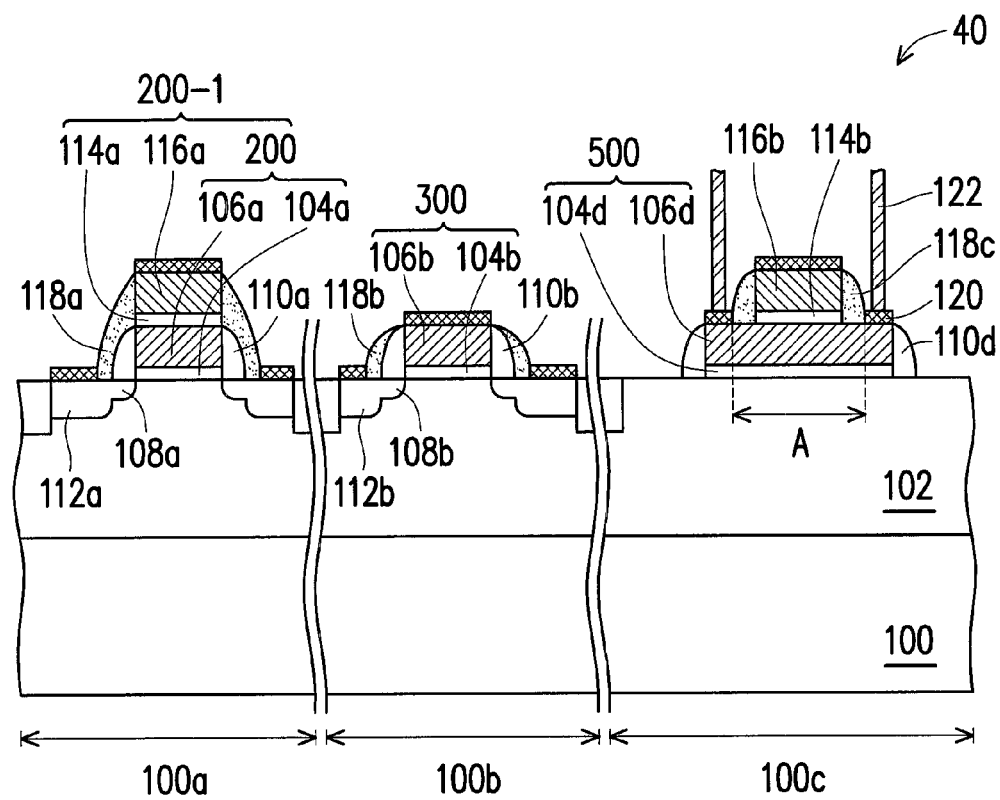

With reference to FIG. 4F, a spacer 118a is formed on a sidewall of the charge storage structure 200-1, a spacer 118b is formed on the sidewall of the stacked structure 300, and a spacer 118c is formed on sidewalls of the dielectric layer 114b and the conductive layer 116b. The spacers 118a, 118b, and 118c are made of silicon oxide, silicon nitride, or silicon oxynitride, for instance, and a method of forming the spacers 118a, 118b, and 118c includes performing a CVD process and then an anisotropic etching process.

Thereafter, a metal layer (not shown) is formed on the substrate 100. The metal layer is, for instance, made of cobalt, and a method of forming the metal layer includes performing a CVD process. An annealing process is performed, such that a portion of the metal layer reacts with silicon to form a silicide layer 120. The silicide layer 120 is formed on an upper surface of the charge storage structure 200-1, on an upper surface of the stacked structure 300, on a portion of the upper surface of the stacked structure 500, and on an upper surface of the conductive layer 116b. Besides, the silicide layer 120 is also formed on surfaces of the doped regions 112a and 112b. The material of the silicide layer 120 includes cobalt silicide. Next, the non-reacted metal layer is removed.

Two conductive plugs 122 are then formed, and the two conductive plugs 122 are electrically connected to the silicide layer 120 on the stacked structure 500. A material of the conductive plugs 122 is, for instance, tungsten. A method of forming the conductive plugs 122 includes forming a dielectric layer (not shown) on the substrate, forming two openings in the dielectric layer, and filling the openings with a conductive layer.

Note that even though a manufacturing process with use of cobalt silicide is performed in the fourth embodiment, a resistor that does not contain cobalt (i.e., a non-cobalt resistor) may be formed in the second periphery area 100c, and an effective resistor area of the non-cobalt resistor is labeled as an area A in FIG. 4F. Namely, in the area A in the second periphery area 100c, the conductive layer 106d may be considered as a polysilicon non-cobalt resistor.

In the semiconductor structure 40 described in the fourth embodiment, the gate oxide layer (i.e., the oxide layer 104a) and the floating gate (i.e., the conductive layer 106a) in the cell area 100a and the logic gate oxide layer (i.e., the oxide layer 104b) and the logic gate (i.e., the conductive layer 106b) in the logic circuit area (i.e., the first periphery area 100b) may be formed in the same patterning step. Hence, the manufacturing process may be simplified, the manufacturing costs may be reduced, and competitiveness may be enhanced.

Besides, when the charge storage structure 200-1 is formed in the cell area 100a, a polysilicon non-cobalt resistor may also be simultaneously formed in the resistor area (i.e., the second periphery area 100c) without performing any additional manufacturing step, such that the design flexibility may be improved.

Fifth Embodiment

FIG. 5A through FIG. 5F are schematic cross-sectional views illustrating a method of forming a semiconductor structure according to a fifth embodiment of the invention. The same reference numbers used in the fifth and fourth embodiments represent the same or similar components; descriptions of the materials and the forming methods of these components may be referred to as those provided in the fourth embodiment and will not be given hereinafter.

Figure 5A:
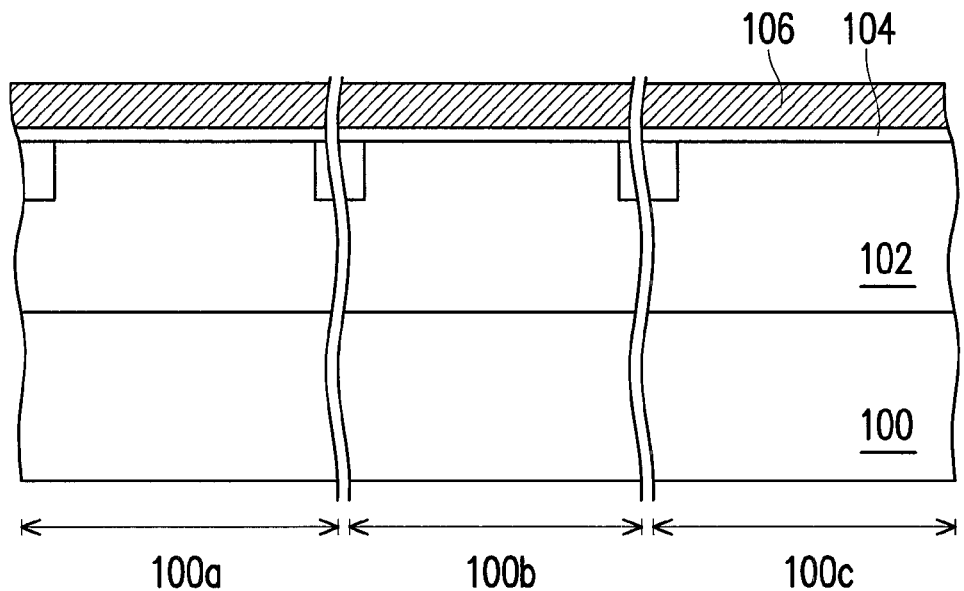
FIG. 5A through FIG. 5F are schematic cross-sectional views illustrating a method of forming a semiconductor structure according to a fifth embodiment of the invention.
Figure 5B:
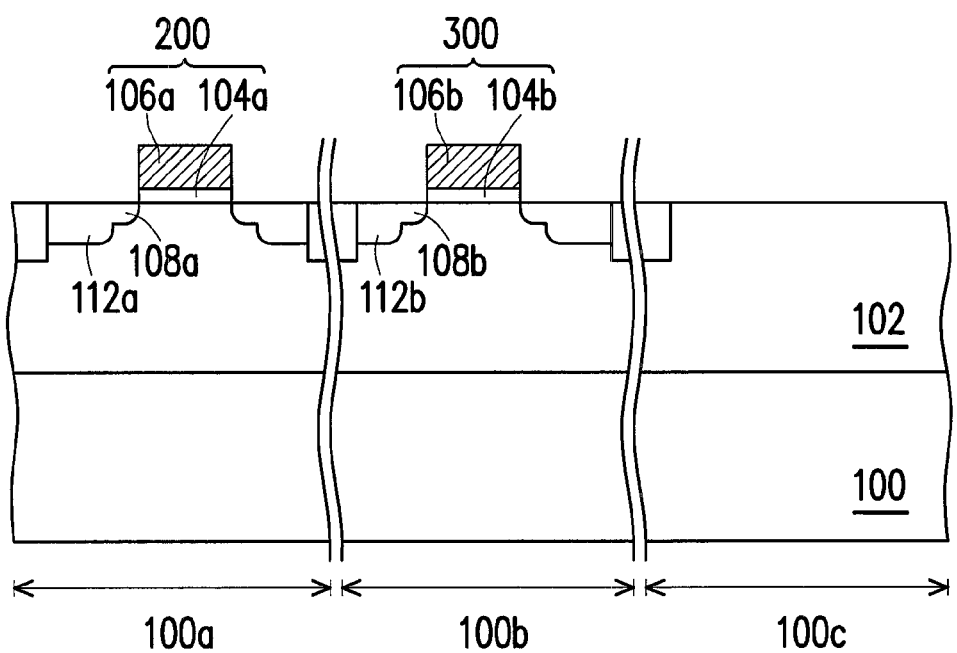

With reference to FIG. 5A, the structure shown in FIG. 4A is provided. The substrate 100 has a cell area 100a, a first periphery area 100b, and a second periphery area 100c. The first periphery area 100b is, for instance, a logic circuit area, and the second periphery area 100c is, for instance, a resistor area. With reference to FIG. 5B, a patterning step is performed to pattern the oxide material layer 104 and the conductive material layer 106; thereby, a stacked structure 200 is formed on the substrate 100 in the cell area 100a, and a stacked structure 300 is formed on the substrate 100 in the first periphery area 100b. The stacked structure 200 includes an oxide layer 104a and a conductive layer 106a that are sequentially arranged on the substrate 100. The stacked structure 300 includes an oxide layer 104a and a conductive layer 106a that are sequentially arranged on the substrate 100. Materials and thicknesses of the oxide layers 104a and 104b are the same, and materials and thicknesses of the conductive layers 106a and 106b are the same. These four layers may be formed in the same patterning process.

Figure 5C:
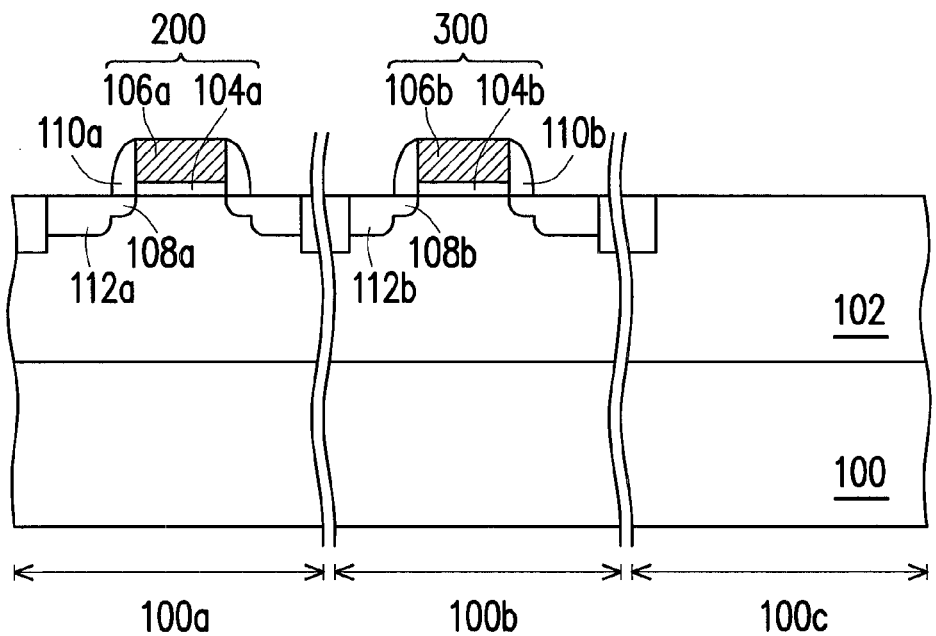

With reference to FIG. 5C, two light doped regions 108a are formed in the substrate 100 beside the stacked structure 200, and two light doped regions 108b are formed in the substrate 100 beside the stacked structure 300. A spacer 110a is formed on a sidewall of the stacked structure 200, and a spacer 110b is formed on a sidewall of the stacked structure 300. After that, two doped regions 112a are formed in the substrate 100 beside the stacked structure 200, and two doped regions 112b are formed in the substrate 100 beside the stacked structure 300.

Figure 5D:
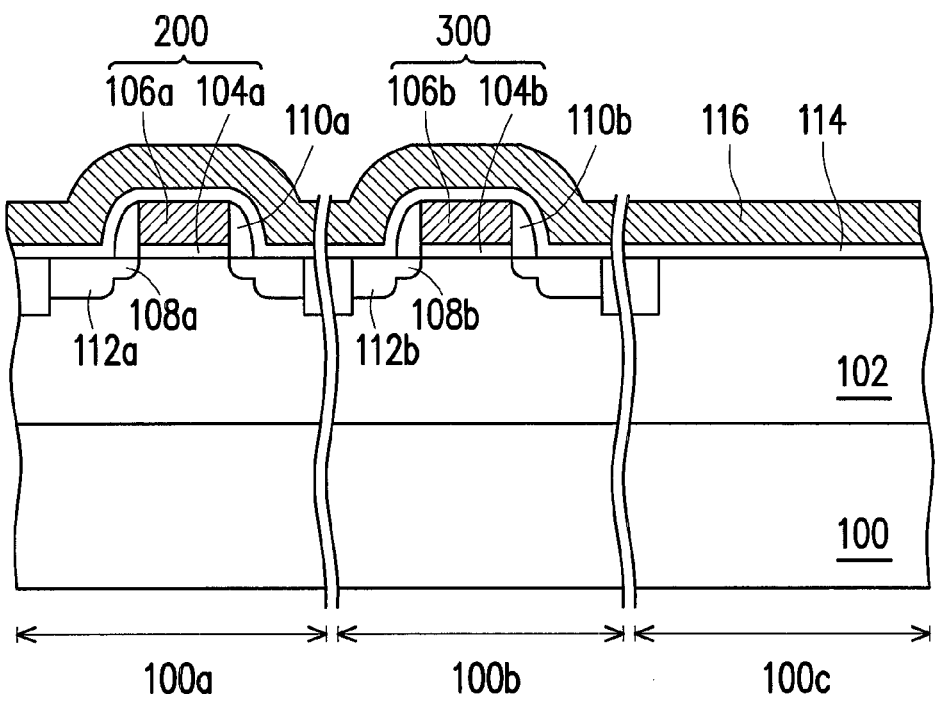

With reference to FIG. 5D, a dielectric material layer 114 and a conductive material layer 116 are sequentially formed on the substrate 100 to cover the stacked structures 200 and 300. The dielectric material layer 114 may have a single-layer structure or a multi-layer structure.

Figure 5E:
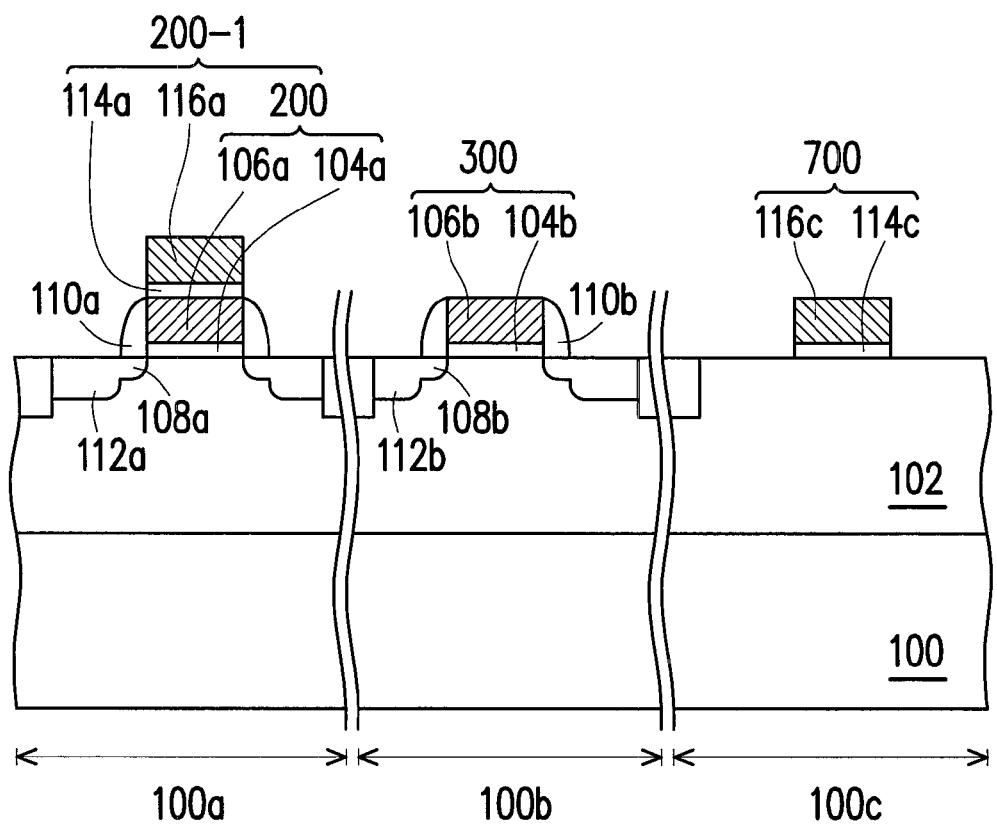

With reference to FIG. 5E, a patterning step is performed to pattern the dielectric material layer 114 and the conductive material layer 116, so as to form a dielectric layer 114a and a conductive layer 116a on the stacked structure 200 and form a dielectric layer 114c and a conductive layer 116c on the second periphery area 100c. The stacked structure 200, the dielectric layer 114a, and the conductive layer 116a in the cell area 100a constitute a charge storage structure 200-1. Besides, when the first periphery area 100b is a logic circuit area, for instance, the stacked structure 300 is a logic transistor, for instance. The dielectric layer 114c and the conductive layer 116c together constitute a stacked structure 700.

Figure 5F:
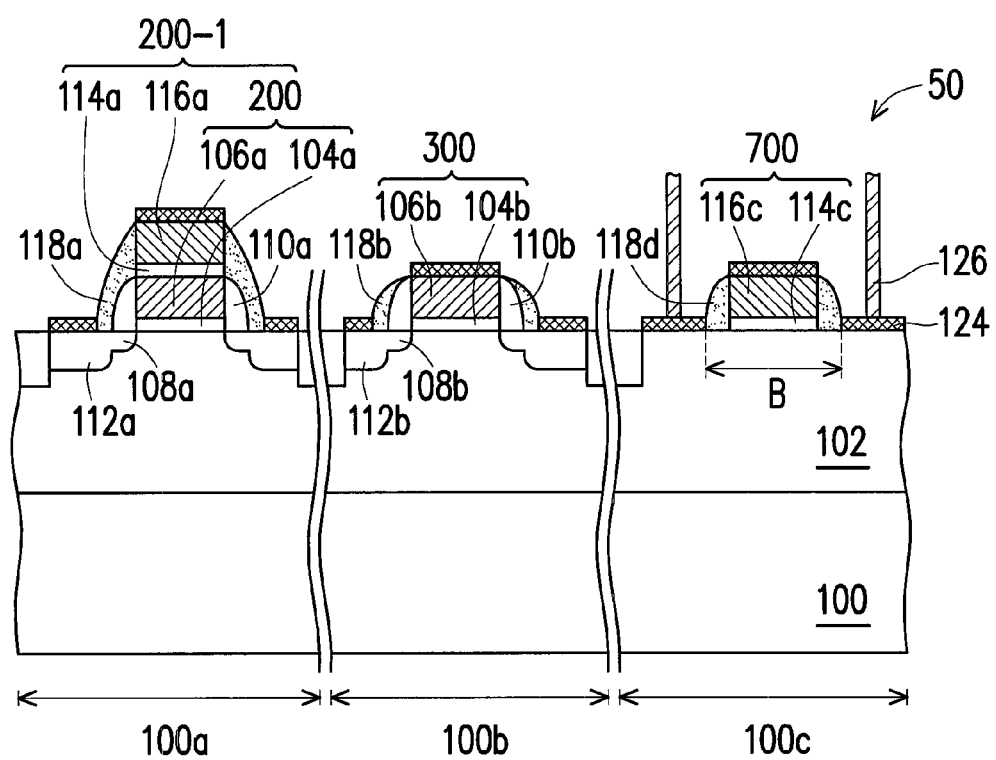

With reference to FIG. 5F, a spacer 118a is formed on a sidewall of the charge storage structure 200-1, a spacer 118b is formed on the sidewall of the stacked structure 300, and a spacer 118d is formed on a sidewall of the stacked structure 700. The spacers 118a, 118b, and 118d may be formed in the same manufacturing step.

A silicide layer 124 is then formed at least on an upper surface of the charge storage structure 200-1, on an upper surface of the stacked structure 300, and on an upper surface of the stacked structure 700. According to the present embodiment, the silicide layer 124 is further formed on surfaces of the doped regions 112a and 112b and on the substrate 100 beside the stacked structure 700 in the second periphery area 100c.

Two conductive plugs 126 are then formed, and the two conductive plugs 126 are electrically connected to the silicide layer 124 located on the substrate 100 beside the stacked structure 700. The materials and the forming methods of the silicide layer 124 and the conductive plugs 126 of the fifth embodiment are similar to the materials and the forming methods of the silicide layer 120 and the conductive plugs 122 described in the fourth embodiment, and therefore no further description is provided hereinafter.

Note that even though a manufacturing process with use of cobalt silicide is performed in the fifth embodiment, a resistor that does not contain cobalt (i.e., a non-cobalt resistor) may be formed in the second periphery area 100c, and an effective resistor area of the resistor is labeled as an area B in FIG. 5F. Namely, in the area B in the second periphery area 100c, the substrate 100 may be considered as an active area non-cobalt resistor.

In the semiconductor structure 50 described in the fifth embodiment, the gate oxide layer (i.e., the oxide layer 104a) and the floating gate (i.e., the conductive layer 106a) in the cell area 100a and the logic gate oxide layer (i.e., the oxide layer 104b) and the logic gate (i.e., the conductive layer 106b) in the logic circuit area (i.e., the first periphery area 100b) may be formed in the same patterning step. Hence, the manufacturing process may be simplified, the manufacturing costs may be reduced, and competitiveness may be enhanced.

Besides, when the charge storage structure 200-1 is formed in the cell area 100a, an active area non-cobalt resistor may also be simultaneously formed in the resistor area (i.e., the second periphery area 100c) without performing any additional manufacturing step, such that the design flexibility may be improved.

In the fourth and fifth embodiments, the periphery area exemplarily has a logic circuit area and a resistor area, which should however not be construed as a limitation to the invention. According to another embodiment, the periphery area may also have a logic circuit area and a capacitor area. This will be elaborated in the sixth embodiment below.

Sixth Embodiment

FIG. 6A through FIG. 6E are schematic cross-sectional views illustrating a method of forming a semiconductor structure according to a sixth embodiment of the invention. The same reference numbers used in the first and sixth embodiments represent the same or similar components; descriptions of the materials and the forming methods of these components may be referred to as those provided in the first embodiment and will not be given hereinafter.

Figure 6A:
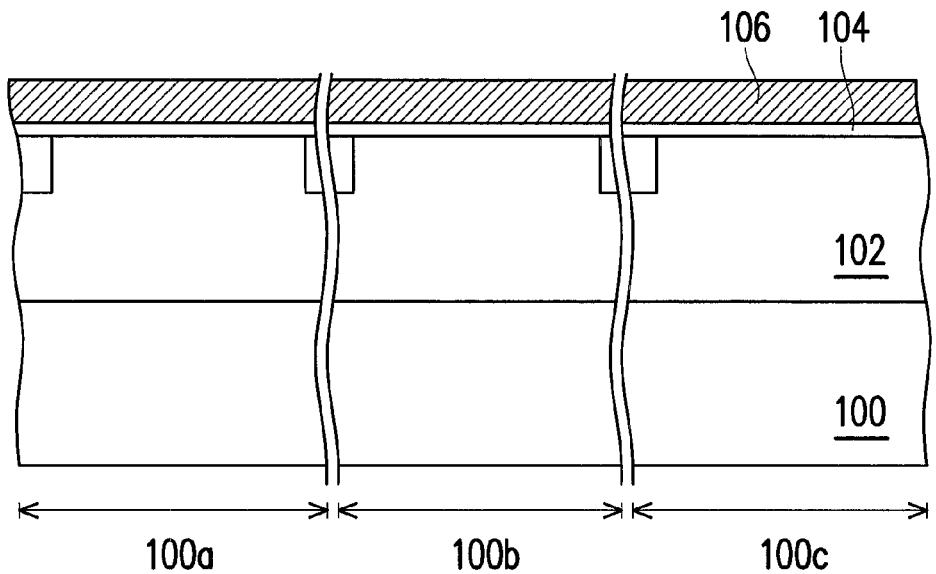
FIG. 6A through FIG. 6E are schematic cross-sectional views illustrating a method of forming a semiconductor structure according to a sixth embodiment of the invention.

As shown in FIG. 6A, a substrate 100 is provided. A well region 102 is formed in the substrate 100. Here, a deep well region (not shown) may be selectively formed in the substrate 100 and located below the well region 102. In the present embodiment, the substrate 100 has a cell area 100a, a first periphery area 100b, and a second periphery area 100c. The first periphery area 100b is, for instance, a logic circuit area, and the second periphery area 100c is, for instance, a capacitor area. In addition, the cell area 100a, the first periphery area 100b, and the second periphery area 100c may be separated from one another via the STI structures. An oxide material layer 104 and a conductive material layer 106 are sequentially formed on the substrate 100 in the cell area 100a, in the first periphery area 100b, and in the second periphery area 100c.

Figure 6B:
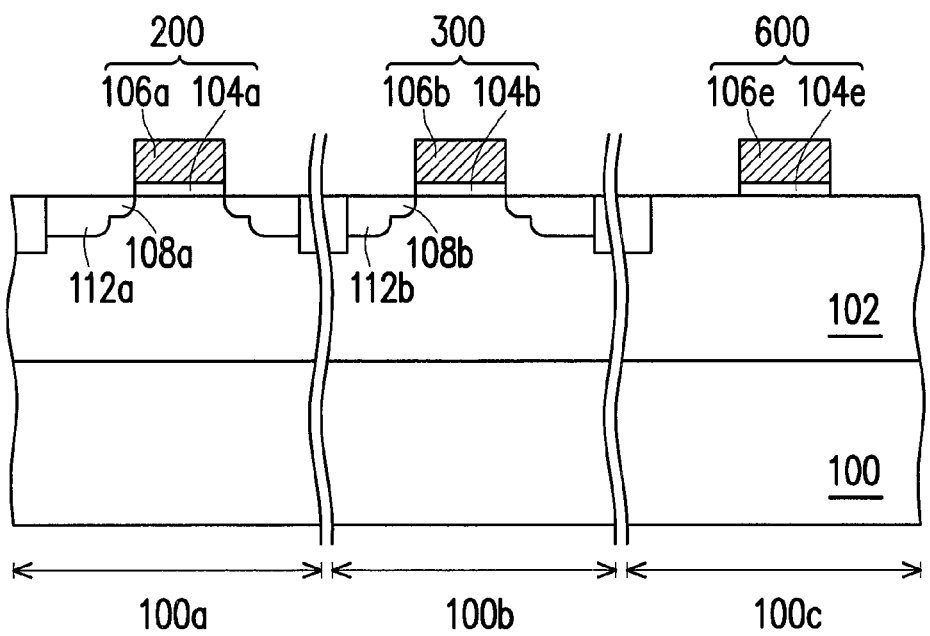

With reference to FIG. 6B, a patterning step is performed to pattern the oxide material layer 104 and the conductive material layer 106; thereby, a stacked structure 200 is formed on the substrate 100 in the cell area 100a, a stacked structure 300 is formed on the substrate 100 in the first periphery area 100b, and a stacked structure 600 is formed on the substrate 100 in the second periphery area 100c. The stacked structure 200 includes an oxide layer 104a and a conductive layer 106a that are sequentially arranged on the substrate 100. The stacked structure 300 includes an oxide layer 104b and a conductive layer 106b that are sequentially arranged on the substrate 100.

The stacked structure 600 includes an oxide layer 104e and a conductive layer 106e that are sequentially arranged on the substrate 100. It should be mentioned that materials and thicknesses of the oxide layers 104a, 104b, and 104e are the same, and materials and thicknesses of the conductive layers 106a, 106b, and 106e are the same. These layers may be formed in the same patterning process.

Figure 6C:
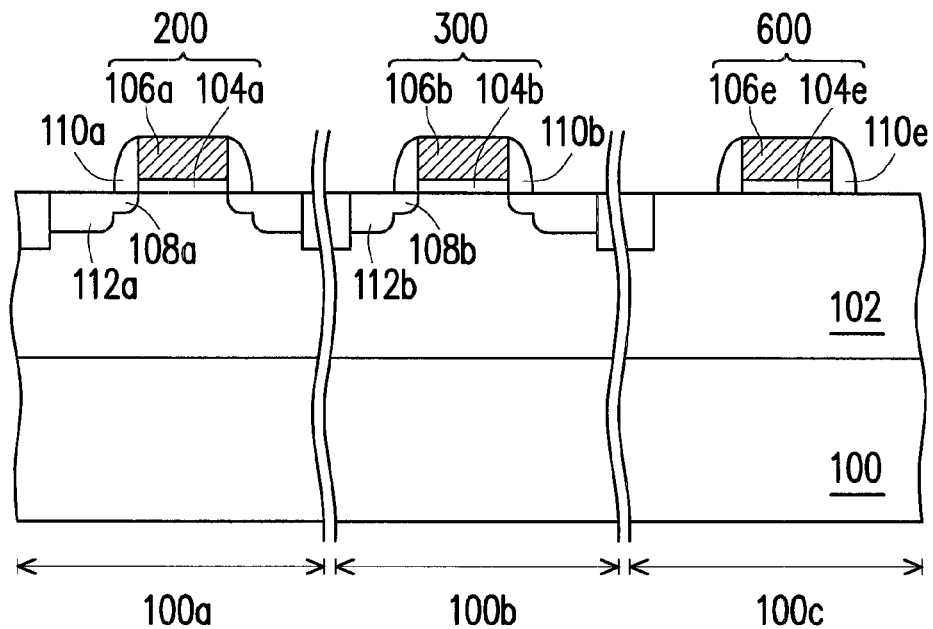

With reference to FIG. 6C, light doped regions 108a are formed in the substrate 100 beside the stacked structure 200, and light doped regions 108b are formed in the substrate 100 beside the stacked structure 300. A spacer 110a is formed on a sidewall of the stacked structure 200, a spacer 110b is formed on a sidewall of the stacked structure 300, and a spacer 110e is formed on a sidewall of the stacked structure 600. The spacers 110a, 110b, and 110e may be formed in the same manufacturing step. After that, two doped regions 112a are formed in the substrate 100 beside the stacked structure 200, and two doped regions 112b are formed in the substrate 100 beside the stacked structure 300.

Figure 6D:
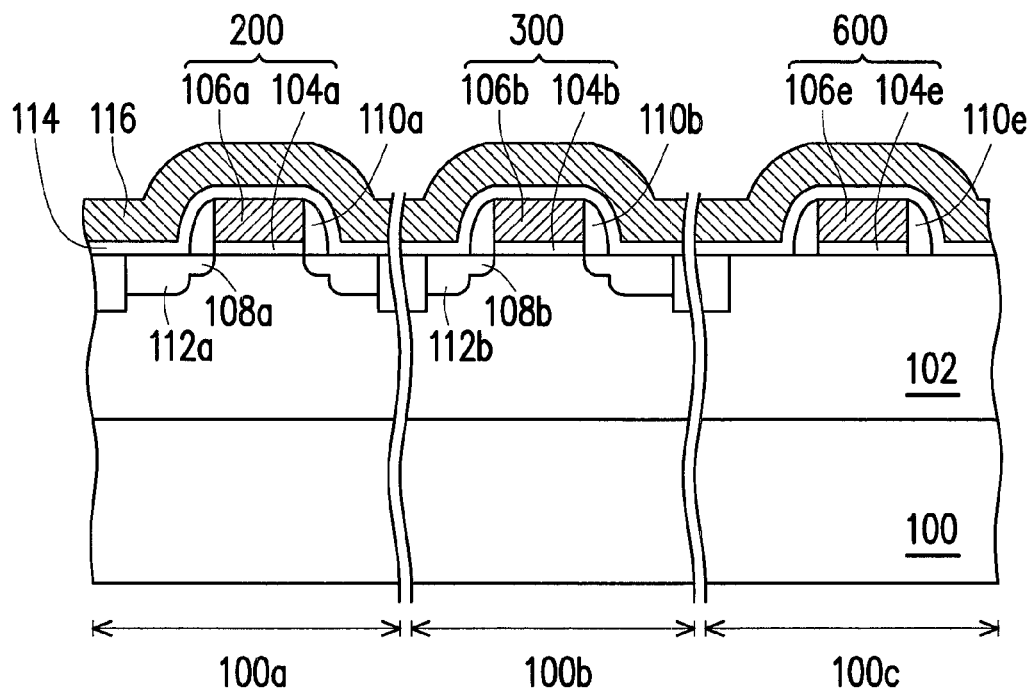

With reference to FIG. 6D, a dielectric material layer 114 and a conductive material layer 116 are sequentially formed on the substrate 100 to cover the stacked structures 200, 300, and 600. The dielectric material layer 114 may have a single-layer structure or a multi-layer structure.

Figure 6E:
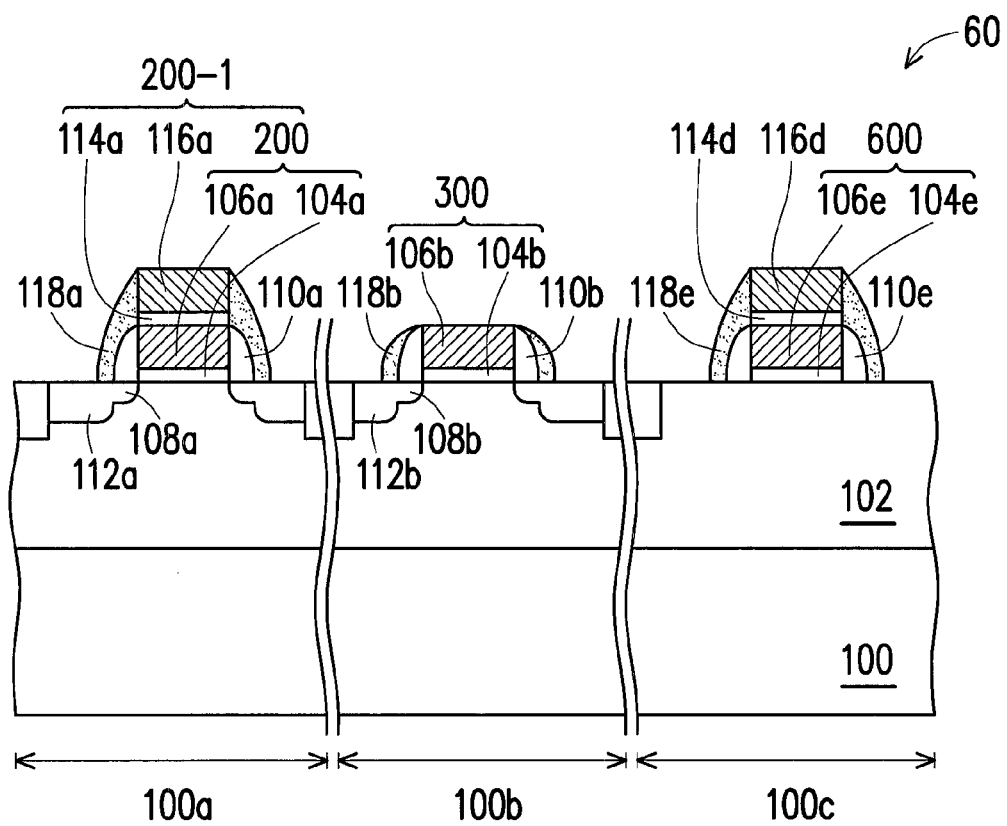

With reference to FIG. 6E, a patterning step is performed to pattern the dielectric material layer 114 and the conductive material layer 116, so as to form a dielectric layer 114a and a conductive layer 116a on the stacked structure 200 and form a dielectric layer 114d and a conductive layer 116d on the stacked structure 600. According to the present embodiment, a sidewall of the dielectric layer 114a and a sidewall of the conductive layer 116a are aligned to the sidewall of the stacked structure 200, and a sidewall of the dielectric layer 114d and a sidewall of the conductive layer 116d are aligned to the sidewall of the stacked structure 600. The stacked structure 200, the dielectric layer 114a, and the conductive layer 116a in the cell area 100a constitute a charge storage structure 200-1. Besides, when the first periphery area 100b is a logic circuit area, for instance, the stacked structure 300 is a logic transistor, for instance. When the second periphery area 100c is a capacitor area, for instance, the stacked structure 600, the dielectric layer 114d, and the conductive layer 116d together constitute a capacitor, for instance. A spacer 118a is then formed on a sidewall of the charge storage structure 200-1, a spacer 118b is formed on the sidewall of the stacked structure 300, and a spacer 118e is formed on the sidewalls of the dielectric layer 114d and the conductive layer 116d. The spacers 118a, 118b, and 118e may be formed in the same manufacturing step.

Figure 7:
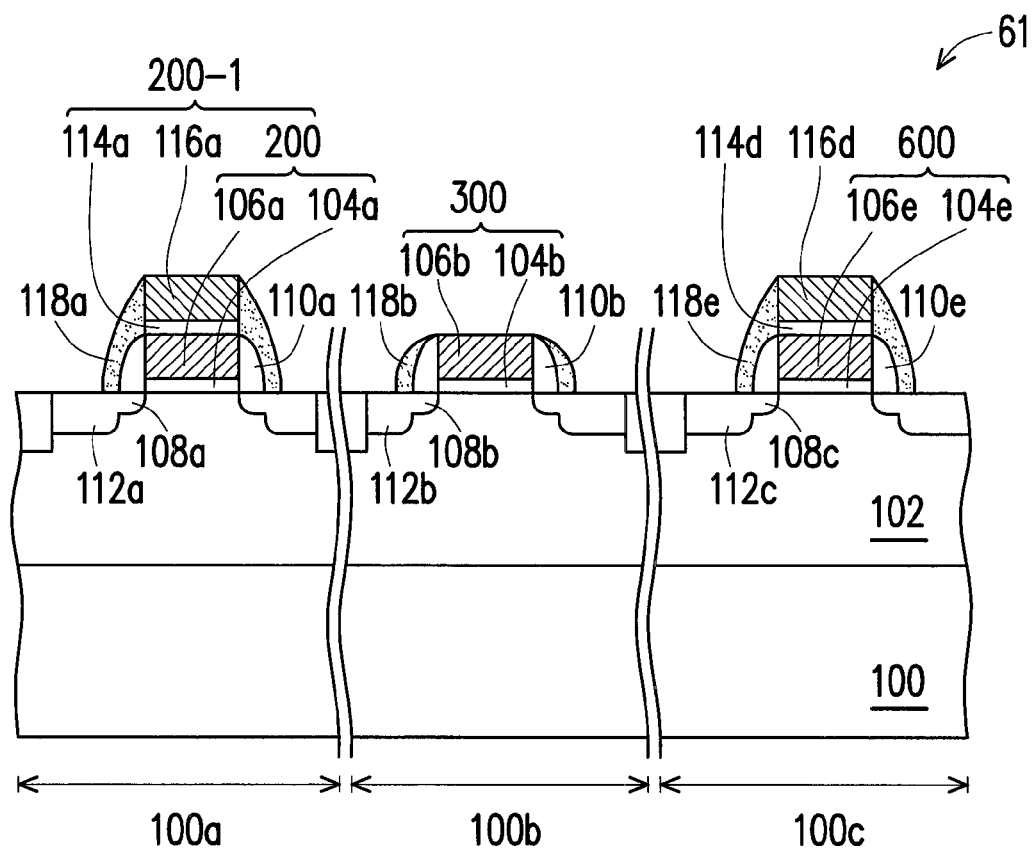
FIG. 7 is a schematic cross-sectional view illustrating another semiconductor device according to the sixth embodiment of the invention.

According to another embodiment, two light doped regions 108c may be simultaneously formed in the substrate 100 beside the stacked structure 600 in the step of forming the light doped regions 108a and 108b. In addition, two doped regions 112c may be simultaneously formed in the substrate 100 beside the stacked structure 600 in the step of forming the doped regions 112a and 112b. Thereby, a semiconductor structure 61 shown in FIG. 7 is formed.

Note that the capacitor constituted by the stacked structure 600 (including the oxide layer 104e and the conductive layer 106e), the dielectric layer 114d, and the conductive layer 116d in the sixth embodiment may be considered as one single capacitor or two capacitors connected in parallel under different operating circumstances. In an embodiment of the invention, when the conductive layer 106e and the conductive layer 116d respectively act as a lower electrode and an upper electrode, the conductive layer 106e, the dielectric layer 114d, and the conductive layer 116d together constitute a polysilicon-insulator-polysilicon (PIP) capacitor. In another embodiment, when a positive voltage is exemplarily applied to the conductive layer 116d and the substrate 100 and a negative voltage is exemplarily applied to the conductive layer 106e, the substrate 100, the oxide layer 104e and the conductive layer 106e together constitute a metal oxide semiconductor (MOS) capacitor, and the MOS capacitor is connected to the PIP capacitor in parallel.

In the semiconductor structures 60 and 61 described in the sixth embodiment, the gate oxide layer (i.e., the oxide layer 104a) and the floating gate (i.e., the conductive layer 106a) in the cell area 100a and the logic gate oxide layer (i.e., the oxide layer 104b) and the logic gate (i.e., the conductive layer 106b) in the logic circuit area (i.e., the first periphery area 100b) may be formed in the same patterning step. Hence, the manufacturing process may be simplified, the manufacturing costs may be reduced, and competitiveness may be enhanced.

Besides, when the charge storage structure 200-1 is formed in the cell area 100a, a capacitor may also be formed in the capacitor area (i.e., the second periphery area 100c) without performing any additional manufacturing step, such that the design flexibility may be improved.

In the fourth embodiment to the sixth embodiment, only a charge storage structure is exemplarily formed in the cell area, which should however not be construed as a limitation to the invention. In another embodiment of the invention, a 2T structure including a charge storage structure and a select transistor may be formed in the cell area. Namely, the peripheral devices described in the fourth embodiment to the sixth embodiment may be integrated with the 2T structure respectively described in the second and third embodiments based on actual design requirements.

To sum up, as described in an embodiment of the invention, a memory unit may be easily integrated with a peripheral logic device, a resistor, or a capacitor through an existing manufacturing process. Here, the memory unit may have a ETOX structure or a 2T structure including a charge storage structure and a select transistor, and a one-time programming (OTP) operation or a multi-time programming (MTP) may be performed based on actual requirements. Moreover, compared to the conventional complicated manufacturing process, the method described herein allows at least one of the peripheral logic device, the resistor, and the capacitor to be simultaneously formed in the step of manufacturing the memory unit. As a result, the manufacturing costs may be significantly reduced, and the competitiveness may be enhanced.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A method of forming a semiconductor structure, comprising:
   providing a substrate, the substrate having a cell area and a logic circuit area;
   sequentially forming an oxide material layer and a first conductive material layer on the substrate in the cell area and in the logic circuit area;
   performing a patterning step to form a first stacked structure on the substrate in the cell area and form a second stacked structure on the substrate in the logic circuit area;

forming a first spacer on a sidewall of the first stacked structure, and forming a second spacer on a sidewall of the second stacked structure;

forming three first doped regions in the substrate beside the first stacked structure, and forming two second doped regions in the substrate beside the second stacked structure, wherein one of the first doped regions is at a distance from the first stacked structure; and forming a dielectric layer and a second conductive layer on the first stacked structure, wherein the dielectric layer and the second conductive layer further extend, along the sidewall of the first stacked structure, to the substrate at one side of the first stacked structure in the cell area, wherein the first stacked structure, a portion of the dielectric layer and a portion of the second conductive layer on the first stacked structure constitute a charge storage structure and the portion of the second conductive layer serves as a control gate, and another portion of the dielectric layer and another portion of the second conductive layer directly on the substrate in the cell area constitute a select transistor and the another portion of the second conductive layer serves as a select gate, and the second stacked structure is a logic transistor.

2. The method of forming the semiconductor structure as recited in claim 1, wherein the dielectric layer has a single-layer structure.

3. A method of forming a semiconductor structure, comprising:

providing a substrate, the substrate having a cell area, a logic circuit area, and a resistor area;

sequentially forming an oxide material layer and a first conductive material layer on the substrate;

performing a patterning step to form a first stacked structure on the substrate in the cell area, and form a second stacked structure on the substrate in the logic circuit area, and form a third stacked structure on the substrate in the resistor area;

forming a first spacer on a sidewall of the first stacked structure, forming a second spacer on a sidewall of the second stacked structure, and forming a third spacer on a sidewall of the third stacked structure;

forming two first doped regions in the substrate beside the first stacked structure, and forming two second doped regions in the substrate beside the second stacked structure; and forming a dielectric layer and a second conductive layer on the first stacked structure, wherein the dielectric layer and the second conductive layer are further formed on the third stacked structure in a manner such that the dielectric layer and the second conductive layer do not cover a portion of an upper surface of the third stacked structure, wherein the first stacked structure, the patterned dielectric layer, and the patterned second conductive layer in the cell area constitute a charge storage structure, and the second stacked structure is a logic transistor.

4. The method of forming the semiconductor structure as recited in claim 3, further comprising forming a fourth spacer on a sidewall of the charge storage structure, forming a fifth spacer on the sidewall of the second stacked structure, forming a sixth spacer on sidewalls of the dielectric layer and the second conductive layer on the third stacked structure, and forming a silicide layer at least on an upper surface of the charge storage structure, on an upper surface of the second stacked structure, on the portion of the upper surface of the third stacked structure, and on an upper surface of the second conductive layer on the third stacked structure.

5. The method of forming the semiconductor structure as claimed in claim 4, wherein a material of the silicide layer comprises cobalt silicide.

6. The method of forming the semiconductor structure as claimed in claim 4, further comprising forming two conductive plugs, the two conductive plugs being electrically connected to the silicide layer on the third stacked structure.

7. A method of forming a semiconductor structure, comprising:

providing a substrate, the substrate having a cell area, a logic circuit area, and a resistor area;

sequentially forming an oxide material layer and a first conductive material layer on the substrate;

performing a patterning step to form a first stacked structure on the substrate in the cell area, and form a second stacked structure on the substrate in the logic circuit area;

forming a first spacer on a sidewall of the first stacked structure, and forming a second spacer on a sidewall of the second stacked structure;

forming two first doped regions in the substrate beside the first stacked structure, and forming two second doped regions in the substrate beside the second stacked structure; and forming a dielectric layer and a second conductive layer on the first stacked structure, wherein the dielectric layer and the second conductive layer are further formed on the substrate in the resistor area to constitute a third stacked structure, wherein the first stacked structure, the dielectric layer, and the second conductive layer in the cell area constitute a charge storage structure, and the second stacked structure is a logic transistor.

8. The method of forming the semiconductor structure as recited in claim 7, further comprising forming a third spacer on a sidewall of the charge storage structure, forming a fourth spacer on the sidewall of the second stacked structure, forming a fifth spacer on a sidewall of the third stacked structure, and forming a silicide layer at least on an upper surface of the charge storage structure, on an upper surface of the second stacked structure, and on an upper surface of the third stacked structure.

9. The method of forming the semiconductor structure as claimed in claim 8, wherein a material of the silicide layer comprises cobalt silicide.

10. The method of forming the semiconductor structure as recited in claim 8, wherein the silicide layer is further formed on the substrate beside the third stacked structure.

11. The method of forming the semiconductor structure as claimed in claim 10, further comprising forming two conductive plugs, the two conductive plugs being electrically connected to the silicide layer located on the substrate beside the third stacked structure.

12. A method of forming a semiconductor structure, comprising:

providing a substrate, the substrate having a cell area, a logic circuit area, and a capacitor area;

sequentially forming an oxide material layer and a first conductive material layer on the substrate;

performing a patterning step to form a first stacked structure on the substrate in the cell area, form a second stacked structure on the substrate in the logic circuit area, and form a third stacked structure on the substrate in the capacitor area;

forming a first spacer on a sidewall of the first stacked structure, forming a second spacer on a sidewall of the second stacked structure, and forming a third spacer on a sidewall of the third stacked structure;

forming two first doped regions in the substrate beside the first stacked structure, and forming two second doped regions in the substrate beside the second stacked structure;

forming a dielectric material layer and a second conductive material layer on the substrate covering the first, second and third stacked structures and covering the first, second and third spacers; and patterning the dielectric material layer and the second conductive material layer, so as to form a first dielectric layer and a first gate layer on the first stacked structure and form a second dielectric layer and a second gate layer on the third stacked structure, wherein the first stacked structure, the first dielectric layer, and the first gate conductive layer in the cell area constitute a charge storage structure, and the second stacked structure is a logic transistor, and the third stacked structure, the second dielectric layer, and the second gate layer in the capacitor area constitute a capacitor.

13. The method of forming the semiconductor structure as recited in claim 12, further comprising forming a fourth spacer on a sidewall of the charge storage structure, forming a fifth spacer on the sidewall of the second stacked structure, and forming a sixth spacer on a sidewall of the capacitor.

14. The method of forming the semiconductor structure as recited in claim 12, wherein two third doped regions are simultaneously formed in the substrate beside the capacitor in the step of forming the two first doped regions and the two second doped regions.

* * * * *